(12) United States Patent
Yoshida et al.

(10) Patent No.: US 12,277,983 B2
(45) Date of Patent: Apr. 15, 2025

(54) SEMICONDUCTOR DEVICE

(71) Applicant: SONY GROUP CORPORATION, Tokyo (JP)

(72) Inventors: Hiroshi Yoshida, Tokyo (JP); Jun Okuno, Kanagawa (JP); Hiroki Koga, Tokyo (JP); Yusuke Shuto, Kanagawa (JP); Takeo Tsukamoto, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 61 days.

(21) Appl. No.: 18/250,486

(22) PCT Filed: Oct. 27, 2021

(86) PCT No.: PCT/JP2021/039594
§ 371 (c)(1),
(2) Date: Apr. 25, 2023

(87) PCT Pub. No.: WO2022/102402
PCT Pub. Date: May 19, 2022

(65) Prior Publication Data
US 2023/0402119 A1 Dec. 14, 2023

(30) Foreign Application Priority Data
Nov. 10, 2020 (JP) .................................. 2020-187246

(51) Int. Cl.
*G11C 11/34* (2006.01)
*G11C 27/00* (2006.01)
(Continued)

(52) U.S. Cl.
CPC ........... *G11C 27/005* (2013.01); *H04N 25/73* (2023.01); *H10B 41/30* (2023.02); *H10B 43/30* (2023.02)

(58) Field of Classification Search
CPC ...... G11C 27/005; H10B 41/30; H10B 43/30; H04N 25/73
(Continued)

(56) References Cited

U.S. PATENT DOCUMENTS 4,064,533 A * 12/1977 Lampe .............. H01L 27/14881
257/E27.083
4,371,953 A * 2/1983 Hyatt ................... G11C 19/287
365/45
(Continued)

FOREIGN PATENT DOCUMENTS

JP 06-028868 A 2/1994
JP 07-021793 A 1/1995
(Continued)

OTHER PUBLICATIONS

International Search Report and Written Opinion of PCT Application No. PCT/JP2021/039594, issued on Feb. 1, 2022, 10 pages of ISRWO.

*Primary Examiner* — Viet Q Nguyen
(74) *Attorney, Agent, or Firm* — CHIP LAW GROUP

(57) ABSTRACT

The present disclosure relates to a semiconductor device enabling to suppress waste of energy consumption. There is provided a semiconductor device including: an input unit configured to input a charge; a memory unit configured to collect and accumulate a charge from the input unit; and an output unit configured to detect and output a charge accumulated in the memory unit. The memory unit includes a transfer unit to which a plurality of pairs of a gate unit and an accumulation unit is connected, the gate unit selects the accumulation unit that accumulates a charge, the transfer unit transfers a charge from the input unit to the accumulation unit selected by the gate unit, the accumulation unit accumulates a charge transferred from the transfer unit, and the transfer unit transfers a charge accumulated in the
(Continued)

accumulation unit selected by the gate unit, to the output unit. The present disclosure can be applied to, for example, an analog memory device.

18 Claims, 35 Drawing Sheets

(51) Int. Cl.
    *H04N 25/73*     (2023.01)
    *H10B 41/30*     (2023.01)
    *H10B 43/30*     (2023.01)

(58) Field of Classification Search
    USPC .................................................. 365/185.03
    See application file for complete search history.

(56) References Cited

U.S. PATENT DOCUMENTS

| | | | | |
|---|---|---|---|---|
| 6,091,619 | A * | 7/2000 | Kogan | G11C 27/024 |
| | | | | 365/45 |
| 6,559,895 | B1 * | 5/2003 | Dosho | G11C 27/024 |
| | | | | 365/45 |
| 6,798,453 | B1 * | 9/2004 | Kaifu | H04N 25/78 |
| | | | | 348/304 |
| 7,898,885 | B2 * | 3/2011 | Sarin | G11C 16/0483 |
| | | | | 365/207 |
| 8,576,317 | B2 * | 11/2013 | Sakakibara | H04N 25/709 |
| | | | | 348/308 |
| 8,934,280 | B1 * | 1/2015 | Kuo | G11C 11/1693 |
| | | | | 365/163 |
| 9,024,700 | B2 * | 5/2015 | Ranta | H01F 21/12 |
| | | | | 327/554 |
| 9,793,905 | B2 * | 10/2017 | Okamoto | H01L 27/1225 |
| 10,109,633 | B2 * | 10/2018 | Kurokawa | G11C 7/1006 |
| 10,222,848 | B2 * | 3/2019 | Kurokawa | G06F 1/3287 |
| 10,277,846 | B2 * | 4/2019 | Asaba | H04N 25/78 |
| 10,635,990 | B1 * | 4/2020 | Park | H01L 29/0692 |
| 11,172,154 | B2 * | 11/2021 | Yin | H04N 25/00 |
| 11,437,000 | B2 * | 9/2022 | Okamoto | G09G 3/20 |
| 11,665,448 | B2 * | 5/2023 | Minagawa | H01L 27/146 |
| | | | | 348/308 |
| 2019/0373195 | A1 * | 12/2019 | Minagawa | H01L 27/14 |
| 2020/0021768 | A1 * | 1/2020 | Lin | H04N 25/706 |

FOREIGN PATENT DOCUMENTS

| | | |
|---|---|---|
| JP | 10-162596 A | 6/1998 |
| WO | 1999/17296 A1 | 4/1999 |

* cited by examiner

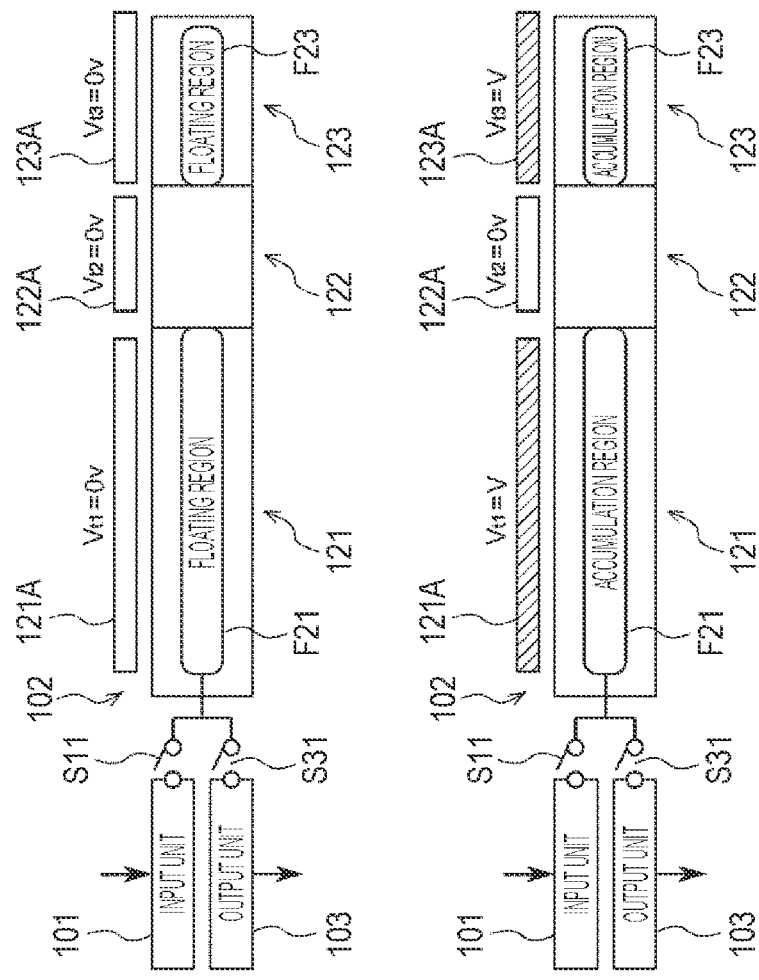

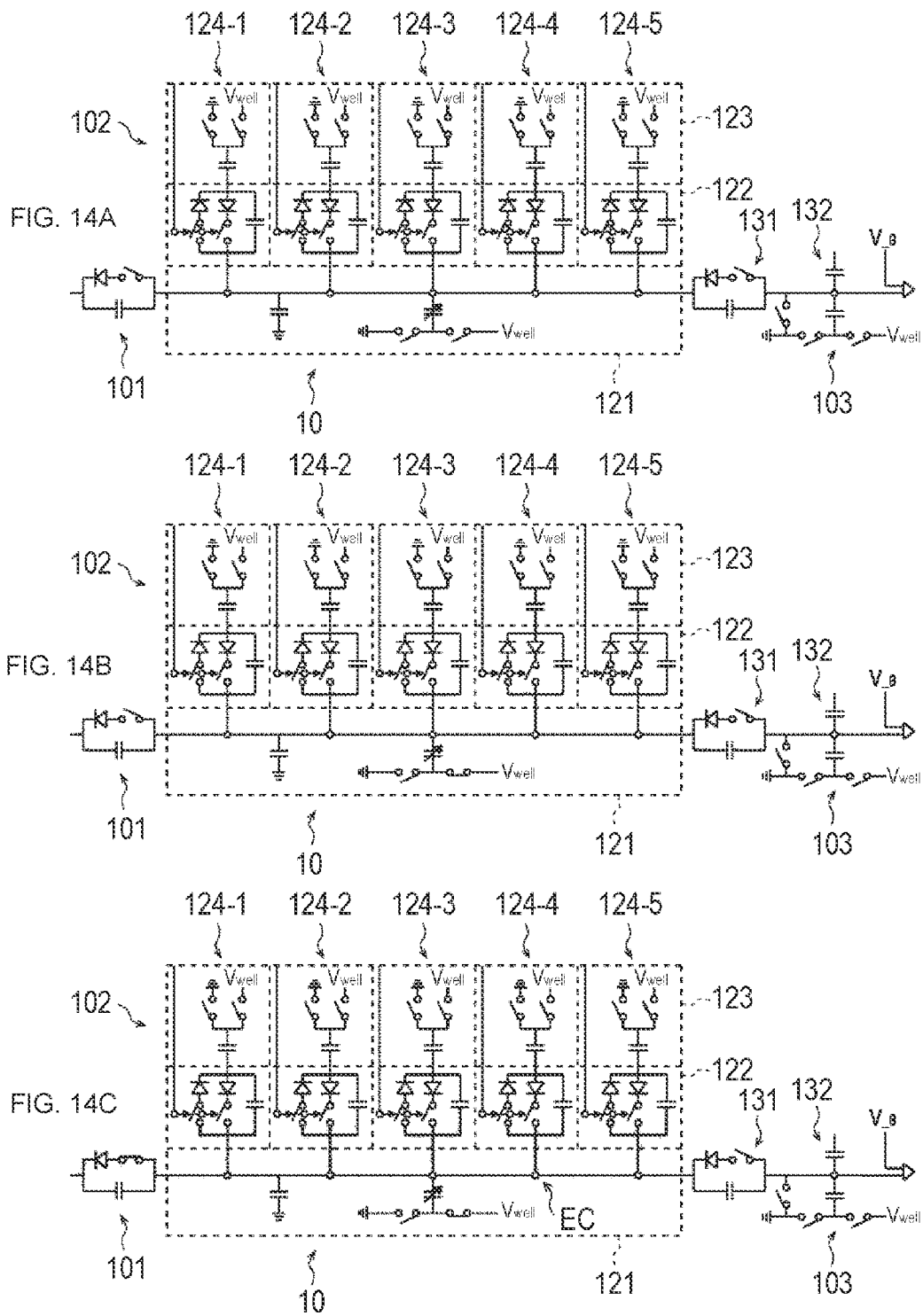

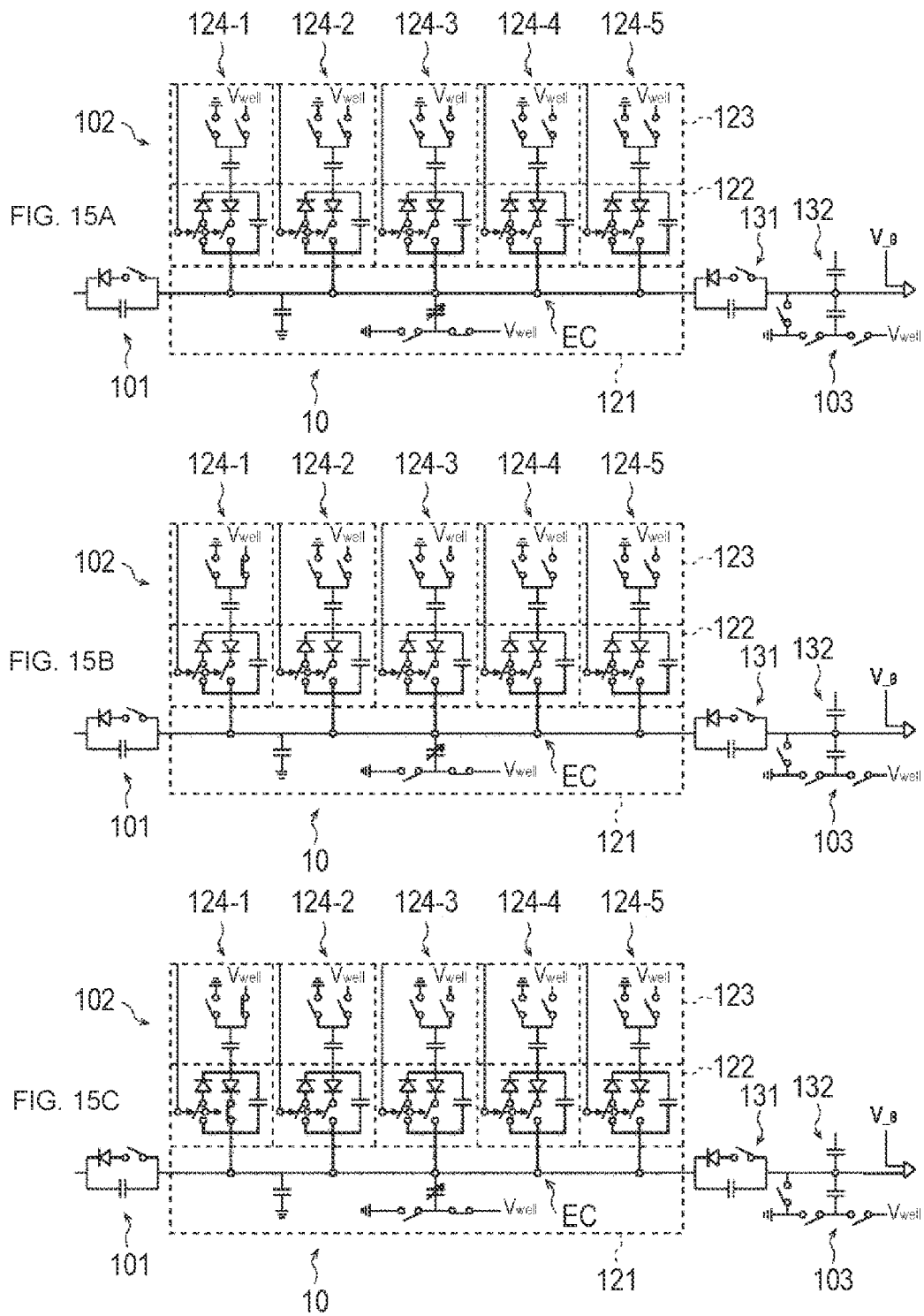

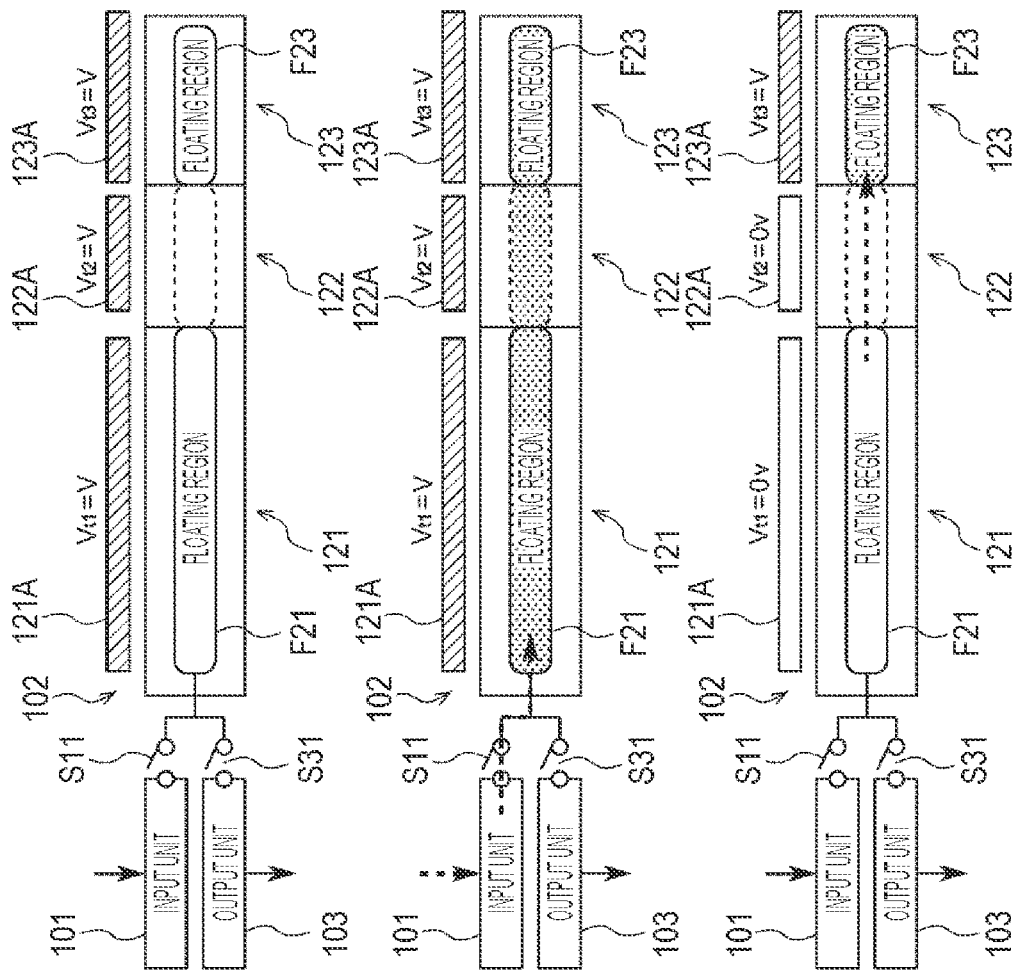

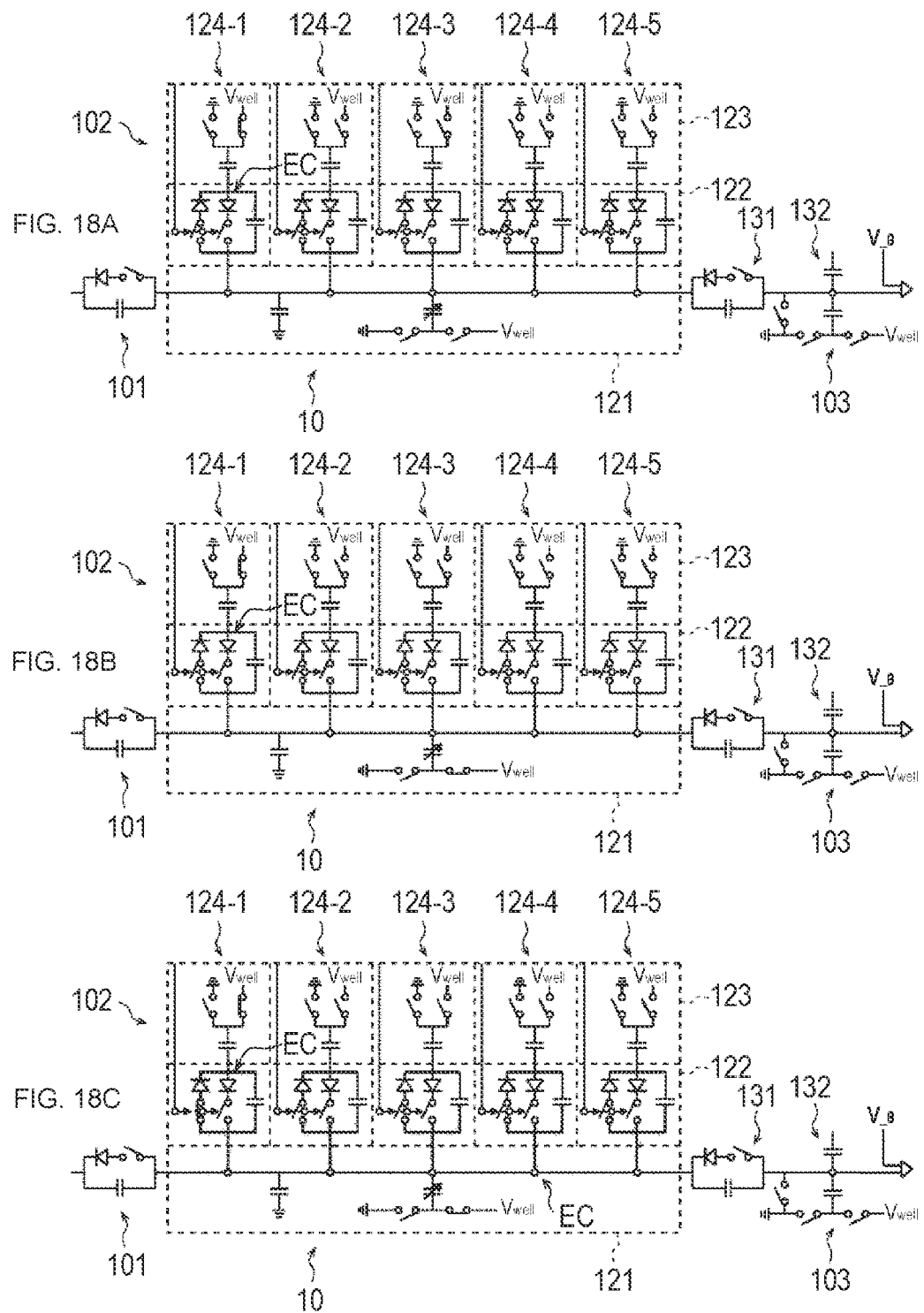

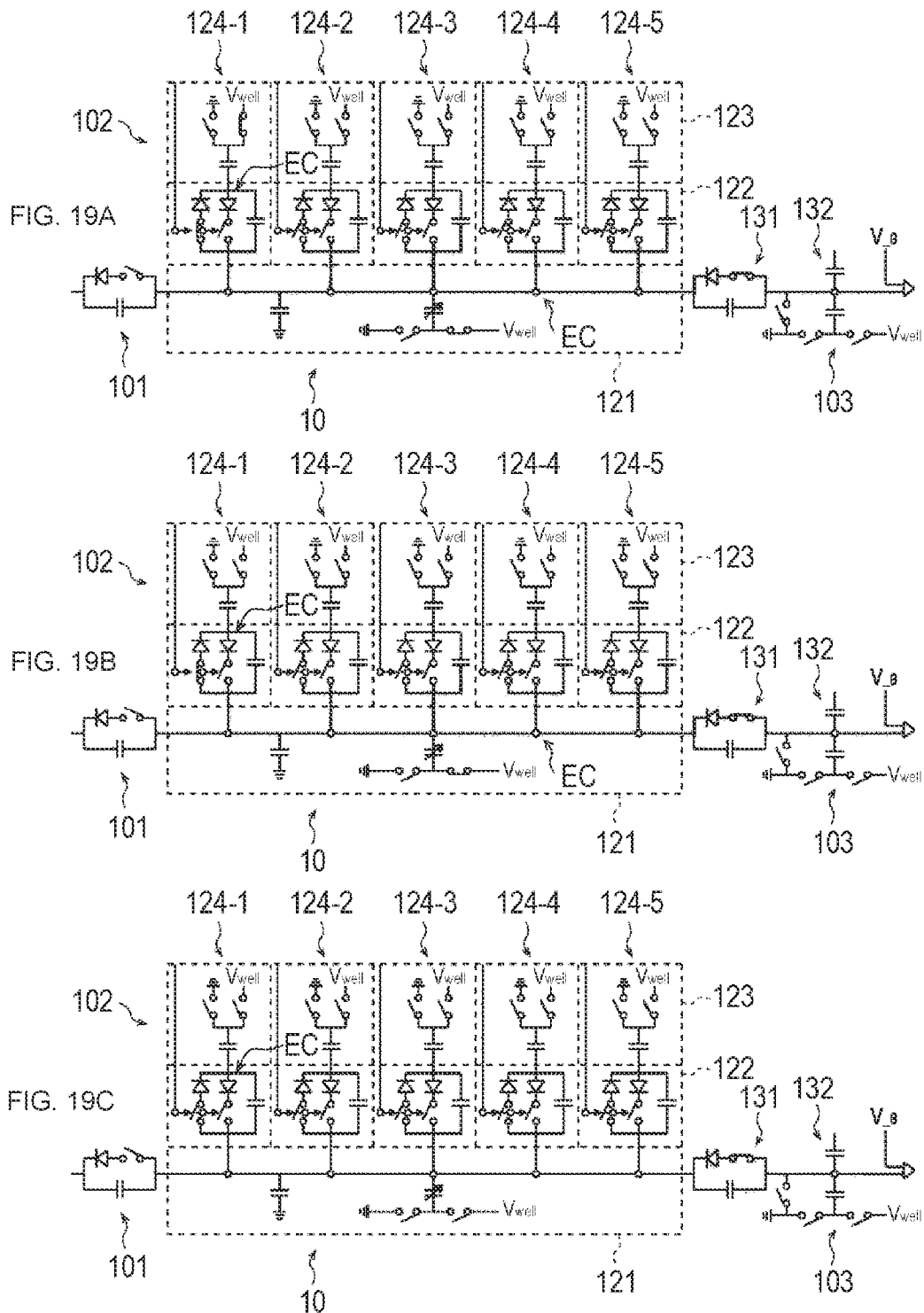

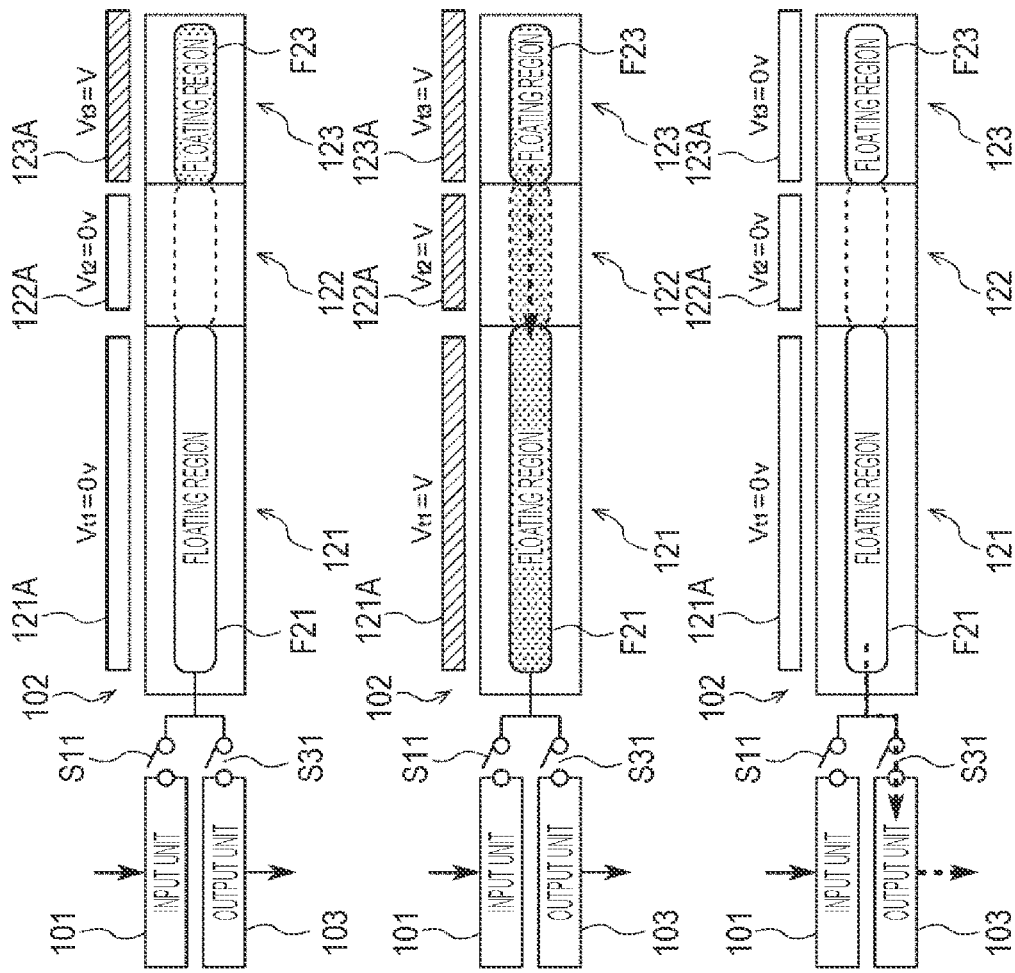

SEMICONDUCTOR DEVICE

CROSS REFERENCE TO RELATED APPLICATIONS

This application is a U.S. National Phase of International Patent Application No. PCT/JP2021/039594 filed on Oct. 27, 2021, which claims priority benefit of Japanese Patent Application No. JP 2020-187246 filed in the Japan Patent Office on Nov. 10, 2020. Each of the above-referenced applications is hereby incorporated herein by reference in its entirety.

TECHNICAL FIELD

The present disclosure relates to a semiconductor device, and particularly to a semiconductor device capable of suppressing waste of energy consumption.

BACKGROUND ART

In recent years, analog memories are expected to be widely used. As a technology related to an analog memory, for example, a technology disclosed in Patent Document 1 is known. Patent Document 1 proposes an analog memory system using a charge coupled device (CCD).

CITATION LIST

Patent Document

Patent Document 1: Japanese Patent Application Laid-Open No. H6-28868

SUMMARY OF THE INVENTION

Problems to be Solved by the Invention

Meanwhile, when an analog memory is put into practical use, it is required to suppress waste of energy consumption during operation.

The present disclosure has been made in view of such a situation, and an object thereof is to suppress waste of energy consumption.

Solutions to Problems

A semiconductor device according to one aspect of the present disclosure is a semiconductor device including: an input unit configured to input a charge; a memory unit configured to collect and accumulate a charge from the input unit; and an output unit configured to detect and output a charge accumulated in the memory unit, in which the memory unit includes a transfer unit to which a plurality of pairs of a gate unit and an accumulation unit is connected, the gate unit selects the accumulation unit that accumulates a charge, the transfer unit transfers a charge from the input unit to the accumulation unit selected by the gate unit, the accumulation unit accumulates a charge transferred from the transfer unit, and the transfer unit transfers a charge accumulated in the accumulation unit selected by the gate unit, to the output unit.

In the semiconductor device according to one aspect of the present disclosure, there are provided: an input unit configured to input a charge; a memory unit configured to collect and accumulate a charge from the input unit; and an output unit configured to detect and output a charge accumulated in the memory unit, in which the memory unit includes a transfer unit to which a plurality of pairs of a gate unit and an accumulation unit is connected, the gate unit selects the accumulation unit that accumulates a charge, the transfer unit transfers a charge from the input unit to the accumulation unit selected by the gate unit, the accumulation unit accumulates a charge transferred from the transfer unit, and the transfer unit transfers a charge accumulated in the accumulation unit selected by the gate unit, to the output unit.

Note that the semiconductor device according to one aspect of the present disclosure may be an independent device or an internal block constituting one device.

BRIEF DESCRIPTION OF DRAWINGS

FIGS. 11A and 11B are conceptual diagrams illustrating an example of a charge-coupled structure in the memory unit.

FIGS. 14A, 14B, and 14C are diagrams illustrating a charge storage procedure by charge coupling in time series.

FIGS. 15A, 15B, and 15C are diagrams illustrating the charge storage procedure by charge coupling in time series.

FIGS. 17A, 17B, and 17C are conceptual diagrams illustrating an example of the charge storage procedure by charge coupling.

FIGS. 18A, 18B, and 18C are diagrams illustrating a charge detection procedure by charge coupling in time series.

FIGS. 19A, 19B, and 19C are diagrams illustrating the charge detection procedure by charge coupling in time series.

FIGS. 20A, 20B, and 20C are conceptual diagram illustrating an example of the charge detection procedure by charge coupling.

MODE FOR CARRYING OUT THE INVENTION

The most widely used current semiconductor memory system is a transistor such as a static random access memory (SRAM) or a dynamic random access memory (DRAM), or a digital memory system in which a capacitor and a transistor are combined. In recent years, with the advent of the Internet of Things (IoT) society, enormous analog signals are sensed, and sharing is progressing in which computation of the enormous sensing signals is processed on an edge side and computation results are transmitted to a cloud side, so that expectations for edge computers are increasing.

In this edge computer, it is assumed that further energy efficiency is required in the future, and the most effective analog computation capable of realizing the extremely high energy efficiency is expected. Here, analog computation has extremely higher energy efficiency than digital computation, but problems such as computation accuracy become apparent and pointed out.

Among these apparent problems of analog computation, a large energy loss when an analog signal outputted as a result of the analog computation is converted into a digital signal and stored in a general digital memory is one of the problems. Therefore, an analog memory system is expected in which an analog signal outputted from analog computation is directly written to an analog memory and directly read from the analog memory.

Here, attention is focused on a method of simply applying the current memory technology to the analog memory. As the most representative example, by showing a case of applying a DRAM form as the analog memory in which charges are accumulated in a capacitor capacitance, similar problems on an extension of other conventional technologies are also comprehensively shown.

Figure 1:
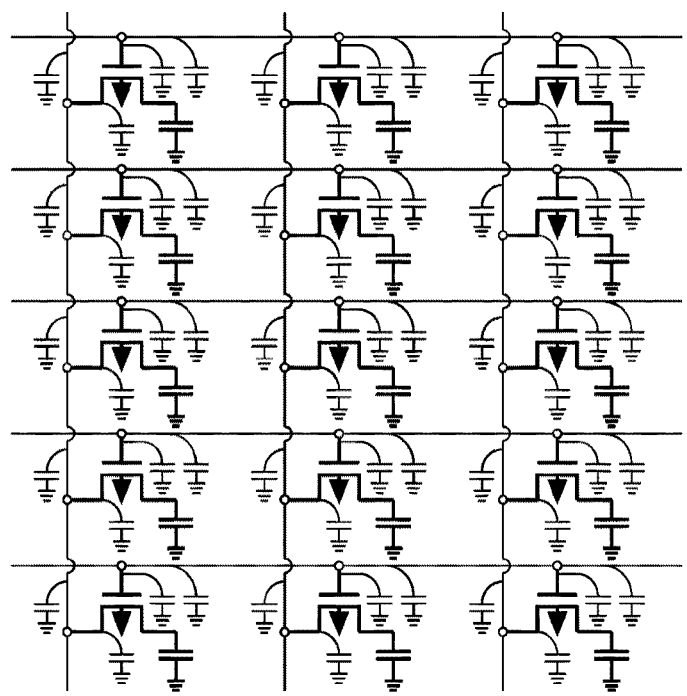
FIG. 1 is a diagram illustrating a configuration example of a memory system in which storage cells are arranged as a two-dimensional memory array.
Figure 2:
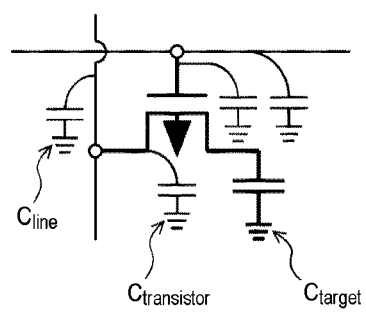
FIG. 2 is a diagram illustrating a capacitance to be discharged and charged when a voltage is applied to wiring of the memory array.

As illustrated in FIG. 1, generally in a current memory system, storage cells are arranged as a two-dimensional memory array, and information of the storage cells is selected by specifying each two-dimensional address. FIG. 2 illustrates a capacitance to be charged and discharged when a voltage V is applied to wiring for designating a storage cell (capacitance $C_{target}$) of an address desired to be selected from the memory array.

Charging with charges by the voltage V is performed not only in the storage cell (capacitance $C_{target}$) but also in a parasitic wiring capacitance (capacitance $C_{line}$) parasitic in the wiring and a parasitic capacitance (capacitance $C_{transistor}$) of all the unselected storage cells electrically connected to the wiring. That is, a capacitance (capacitance $C_{total}$) to be charged and discharged is expressed by the following Equation (1).

$$C_{total} = C_{target} + C_{line} + C_{transistor} \tag{1}$$

Originally, it is ideal that energy can be limited to energy $(C_{target} \times V^2)$ consumed only by the selected storage cell (capacitance $C_{target}$). However, in the current two-dimensional memory array, unintended waste due to energy consumption $((C_{line} + C_{transistor}) \times V^2)$ by the parasitic capacitance $(C_{line} + C_{transistor})$ attached to the address wiring designating the storage cell is always accompanied. This loss of energy consumption is much larger than energy consumed only by the storage cell (capacitance $C_{target}$) and is an essential problem in aiming at low energy consumption. Furthermore, it is obvious that this consumed energy tends to increase as a scale of the memory array increases.

Meanwhile, as another method of the analog memory, a method using a charge coupled device (CCD) has also been proposed (for example, Patent Document 1 described above). An object of the technology disclosed in Patent Document 1 is to provide a memory device for realizing an analog memory or a multi-value memory that is relatively easy to manufacture and has a small circuit scale in a case where a CCD is used.

Specifically, a configuration has been proposed including: a linearly arranged CCD array; a refresh circuit that is connected to a CCD at one end of the CCD array and is for inputting data at a start end; a shaping circuit that is connected to the CCD at another end of the CCD array and is for preventing data degradation; a feedback line that connects an output of the shaping circuit to an input of the refresh circuit; and a phase difference clock line that performs data transfer of the CCD array (FIG. 1 of Patent Document 1 described above).

Figure 3:
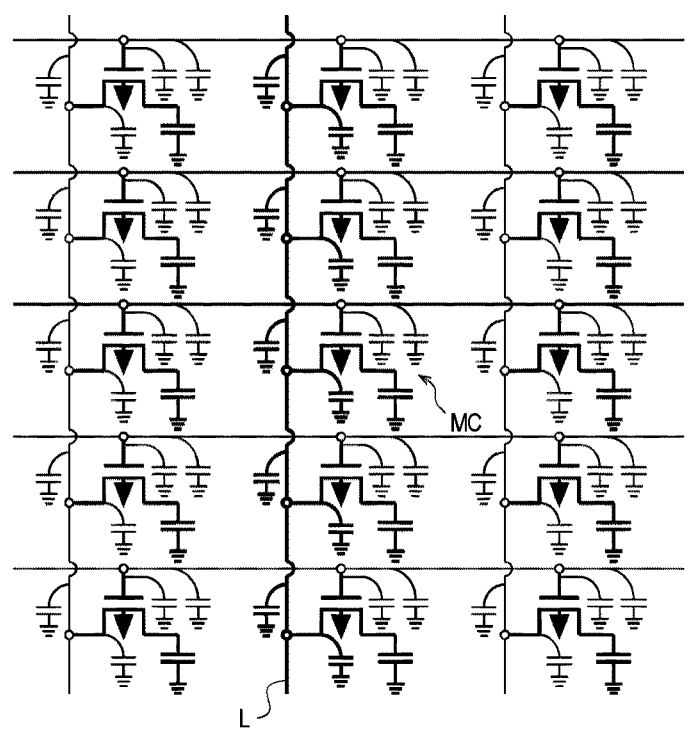
FIG. 3 is a diagram illustrating an example of a charge with which a parasitic capacitance of the wiring of the memory array is charged.

The present disclosure proposes a method of reducing energy consumption $((C_{line} + C_{transistor}) \times V^2)$ that is more wasted than a parasitic capacitance parasitic in wiring of an analog memory array system, and storing a charge as an information amount in a storage cell as it is as an analog value. That is, as illustrated in FIG. 3, if a designated storage cell MC is charged with the charge serving as information and the parasitic capacitance of wiring L is also charged simultaneously, the charge with which the parasitic capacitance of the wiring L is charged is canceled after the charge serving as the information is stored in the storage cell MC, resulting in waste of energy consumption.

Furthermore, in the present disclosure, for the analog memory array system using a transfer technology of the CCD disclosed in Patent Document 1 described above, energy consumption by repetitive application operation according to a phase difference of a voltage to wiring of a phase difference clock line that is for transferring the charge is reduced. In particular, in the technology disclosed in Patent Document 1 described above, in order to circulate and read the stored analog charge, charging and discharging with a repeated voltage to the wiring of the phase difference clock line greatly wastes energy consumption.

Therefore, the technology according to the present disclosure (the present technology) proposes a technology capable of solving the above-described problems and suppressing waste of energy consumption during operation. Hereinafter, embodiments of the present technology will be described with reference to the drawings.

1. First Embodiment (System Configuration)

Figure 4:
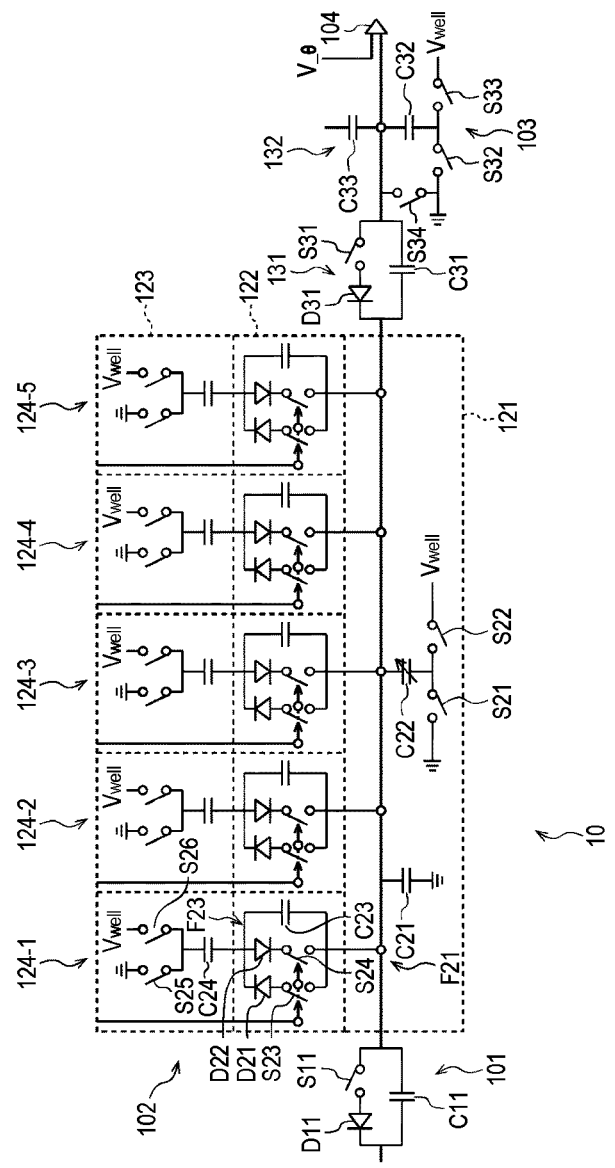
FIG. 4 is a circuit diagram illustrating a first example of a configuration of an embodiment of an analog memory device to which the present technology is applied.

FIG. 4 is a circuit diagram illustrating a first example of a configuration of an embodiment of an analog memory device to which the present technology is applied.

An analog memory device 10 is an analog memory system capable of directly writing a charge outputted from an analog computation unit to an analog memory and directly reading the written charge. The analog memory device 10 includes an input unit 101, a memory unit 102, an output unit 103, and a comparison unit 104.

The input unit 101 includes a diode D11, a switch S11, and a capacitor C11. The input unit 101 inputs charges (electrons or holes) from outside into the memory unit 102, by electrically switching between connection and interruption between with (a transfer unit 121 of) the memory unit 102.

The memory unit 102 includes the transfer unit 121, a gate unit 122, and an accumulation unit 123. In the memory unit 102, a plurality of pairs of the gate unit 122 and the accumulation unit 123 is connected to the transfer unit 121. Hereinafter, the pair of the gate unit 122 and the accumulation unit 123 is also referred to as a charge holding unit 124. In FIG. 4, charge holding units 124-1 to 124-5 are individually connected to the transfer unit 121.

The transfer unit 121 includes capacitors C21 and C22 and switches S21 and S22. Furthermore, the transfer unit 121 has a floating region F21 that is not in electrical contact from outside of the system. The transfer unit 121 transfers (transports) charges from the input unit 101 to the charge holding units 124-1 to 124-5. Furthermore, the transfer unit 121 transfers (transports) charges from the charge holding units 124-1 to 124-5 to the output unit 103.

In the charge holding units 124-1 to 124-5 connected to the transfer unit 121, the gate unit 122 selects the accumulation unit 123 that accumulates charges from the transfer unit 121 or selects the accumulation unit 123 that reads charges to the transfer unit 121. Each gate unit 122 includes diodes D21 and D22, switches S23 and S24, and a capacitor C23.

The accumulation unit 123 includes switches S25 and S26 and a capacitor C24. Furthermore, the accumulation unit 123 has a floating region F23 that is not in electrical contact from outside of the system. When selected by the gate unit 122, the accumulation unit 123 collects and accumulates charges transferred from the transfer unit 121. The charges accumulated in the accumulation unit 123 are transported from the accumulation unit 123 selected by the gate unit 122 to the transfer unit 121.

Figure 5:
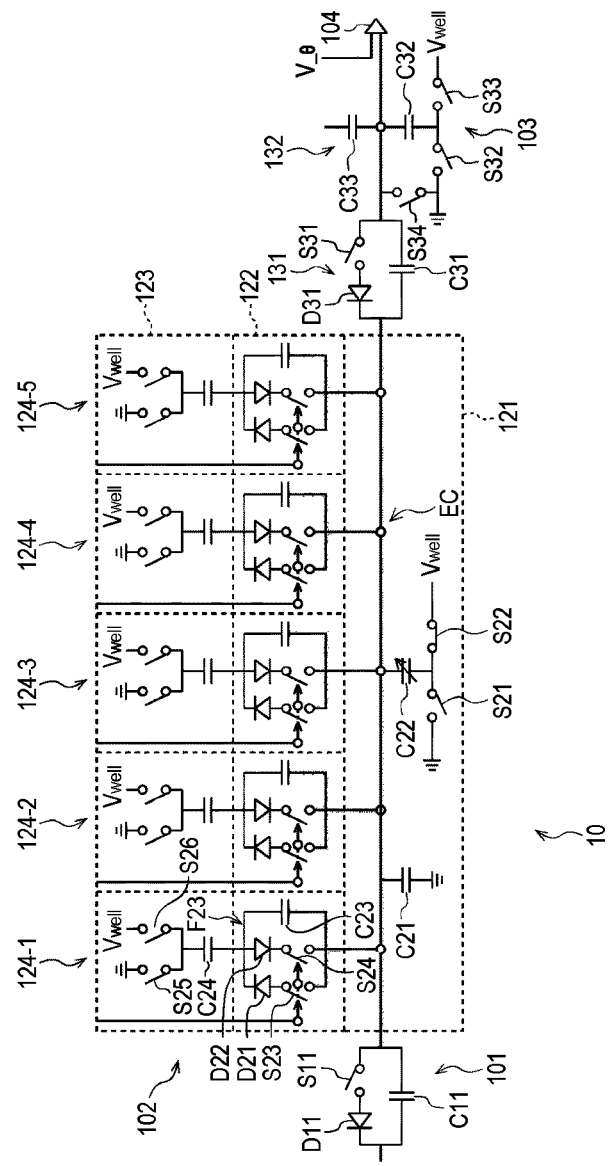
FIG. 5 is a diagram illustrating an example of charge accumulation in a transfer unit of the memory unit in FIG. 4.
Figure 6:
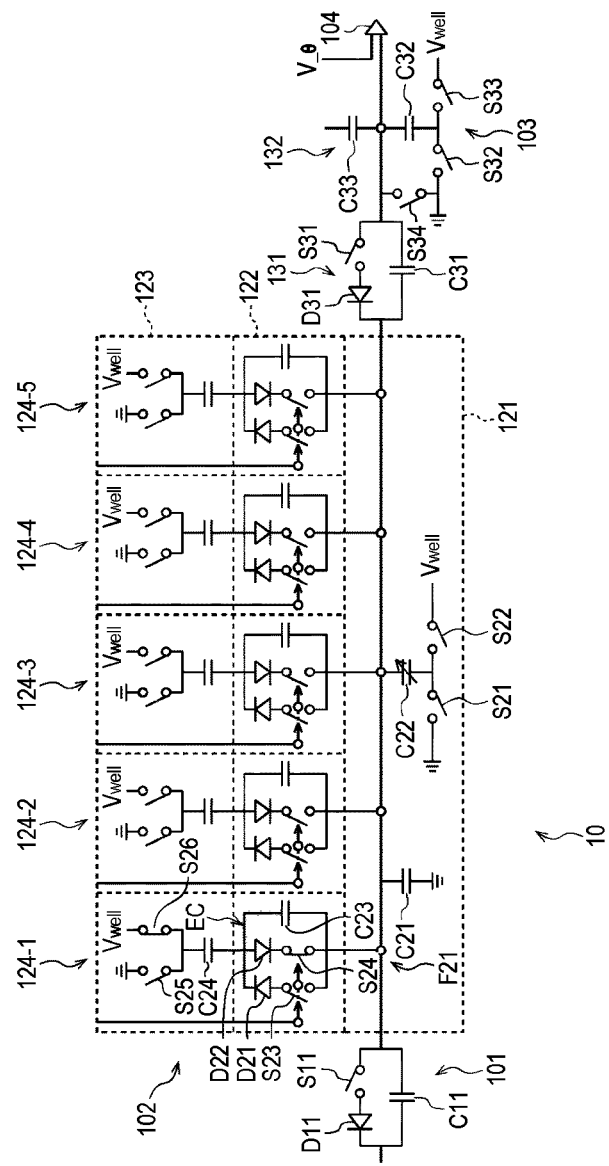
FIG. 6 is a diagram illustrating an example of charge transfer from the transfer unit to an accumulation unit in the memory unit of FIG. 4.

Specific examples of charge accumulation and charge transfer in the transfer unit 121 include those illustrated in FIGS. 5 and 6. In FIG. 5, in the transfer unit 121, when the switch S22 is turned into an ON state, charges from the input unit 101 are accumulated (EC in the figure). Thereafter, in FIG. 6, in the gate unit 122, when the switch S24 is turned into an ON state, charges are transferred from the transfer unit 121 to the accumulation unit 123 (EC in the figure).

Returning to FIG. 4, the output unit 103 includes an output gate unit 131 and a detection unit 132. The output gate unit 131 includes a diode D31, a switch S31, and a capacitor C31. The output gate unit 131 inputs (transfers) charges from the memory unit 102 to the output unit 103, by electrically switching between connection and interruption between with (the transfer unit 121 of) the memory unit 102.

The detection unit 132 includes switches S32 to S34 and capacitors C32 to C33. The detection unit 132 extracts a charge from the memory unit 102 via the output gate unit 131 and detects the charge. That is, the detection unit 132 extracts a charge transferred from the accumulation unit 123 of the memory unit 102 via the gate unit 122 and the transfer unit 121, and detects the charge.

The comparison unit 104 includes a comparator. The comparison unit 104 compares a voltage corresponding to a charge from (the detection unit 132 of) the output unit 103 with a threshold voltage $V\theta$, and outputs a signal (a time signal) corresponding to the comparison result. Note that FIG. 4 illustrates a case where the comparison unit 104 is provided at a subsequent stage of the output unit 103 and the time signal is outputted, but an output format of the signal outputted from the output unit 103 is not limited thereto.

As described above, the analog memory device 10 of FIG. 4 includes the input unit 101 that inputs charges, the memory unit 102 that collects and accumulates charges from the input unit 101, and the output unit 103 that detects and outputs charges accumulated in the memory unit 102. Furthermore, the memory unit 102 includes the transfer unit 121 to which a plurality of pairs (the charge holding units 124) of the gate unit 122 and the accumulation unit 123 is connected.

Then, the gate unit 122 selects the accumulation unit 123 that accumulates the charges, the transfer unit 121 transfers charges from the input unit 101 to the accumulation unit 123 selected by the gate unit 122, and the accumulation unit 123 accumulates the charges transferred from the transfer unit 121. Furthermore, the transfer unit 121 transfers charges accumulated in the accumulation unit 123 selected by the gate unit 122, to the output unit 103.

Moreover, the transfer unit 121 and the accumulation unit 123 have the floating region (F21, F23) that is not in electrical contact from outside. This floating region makes it possible to accumulate charges in the transfer unit 121 or transfer charges from the transfer unit 121 to the accumulation unit 123 to accumulate the charges.

2. Second Embodiment (System Configuration)

Figure 7:
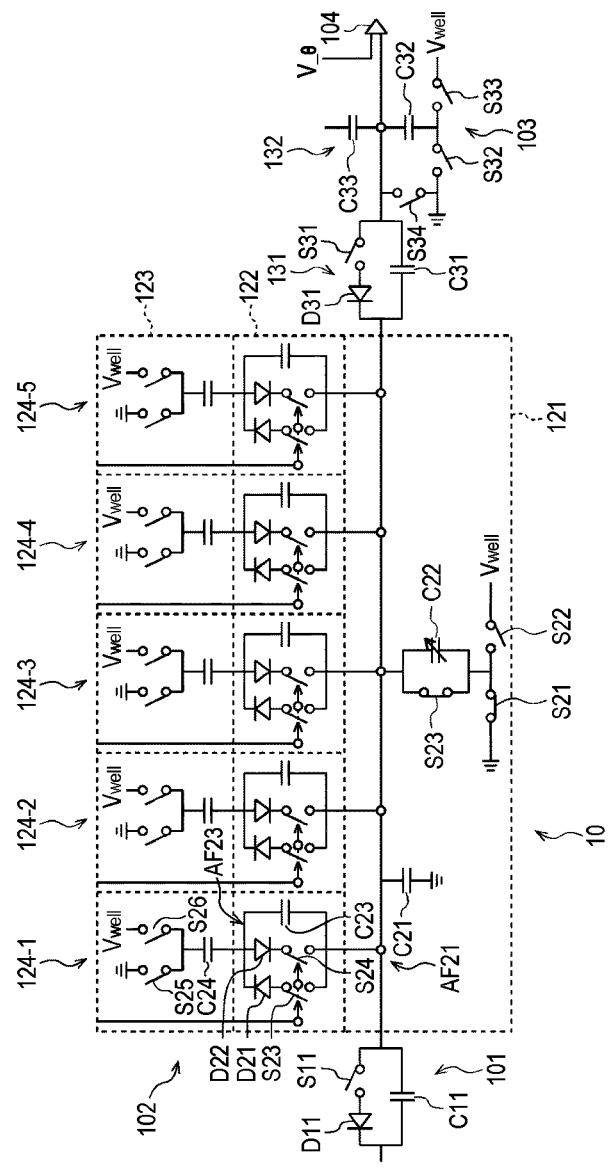
FIG. 7 is a circuit diagram illustrating a second example of a configuration of an embodiment of the analog memory device to which the present technology is applied.

FIG. 7 is a circuit diagram illustrating a second example of a configuration of an embodiment of the analog memory device to which the present technology is applied.

In the circuit diagram of FIG. 7, portions corresponding to those in the circuit diagram of FIG. 4 are denoted by the same reference numerals, and the description thereof will be omitted as appropriate.

In FIG. 7, a memory unit 102 includes a transfer unit 121, a gate unit 122, and an accumulation unit 123. In the memory unit 102, charge holding units 124-1 to 124-5 are individually connected to the transfer unit 121. The transfer unit 121 and the accumulation unit 123 respectively include charge accumulation region formation parts AF21 and AF23 where a region capable of accumulating charges is formed by an electric field from outside.

The transfer unit 121 further includes a switch S23 in addition to capacitors C21 and C22 and switches S21 and S22. In the transfer unit 121, a floating state is formed in the charge accumulation region formation part AF21 by generation of an electric field from outside, and a state where charges can be accumulated is obtained.

Figure 8:
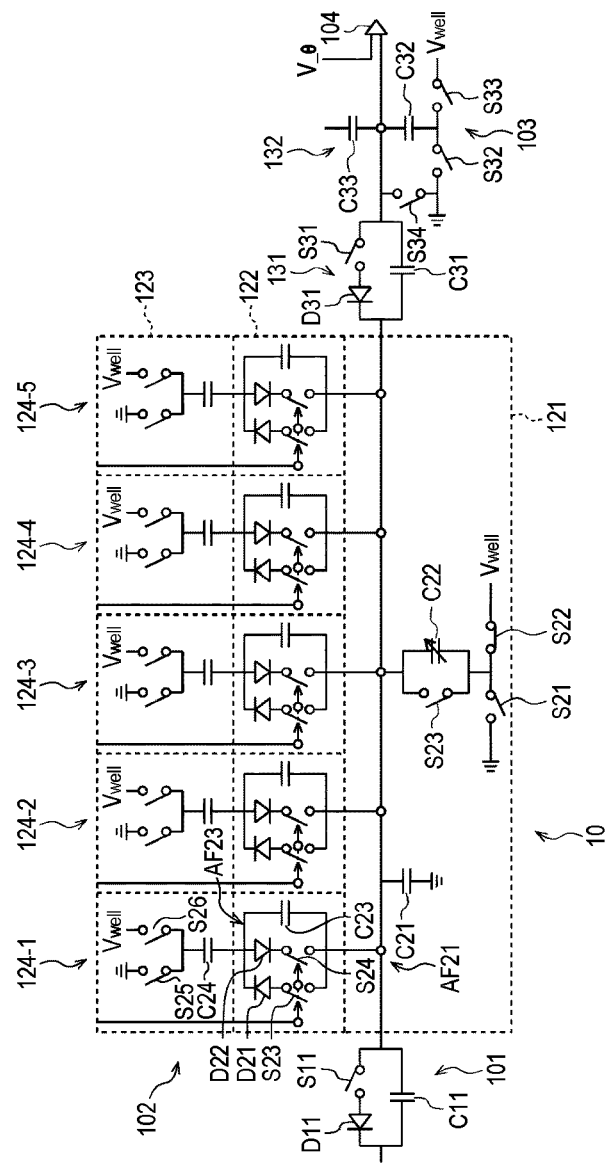
FIG. 8 is a diagram illustrating an example of formation of a state where charges can be accumulated in the transfer unit of the memory unit in FIG. 7.
Figure 9:
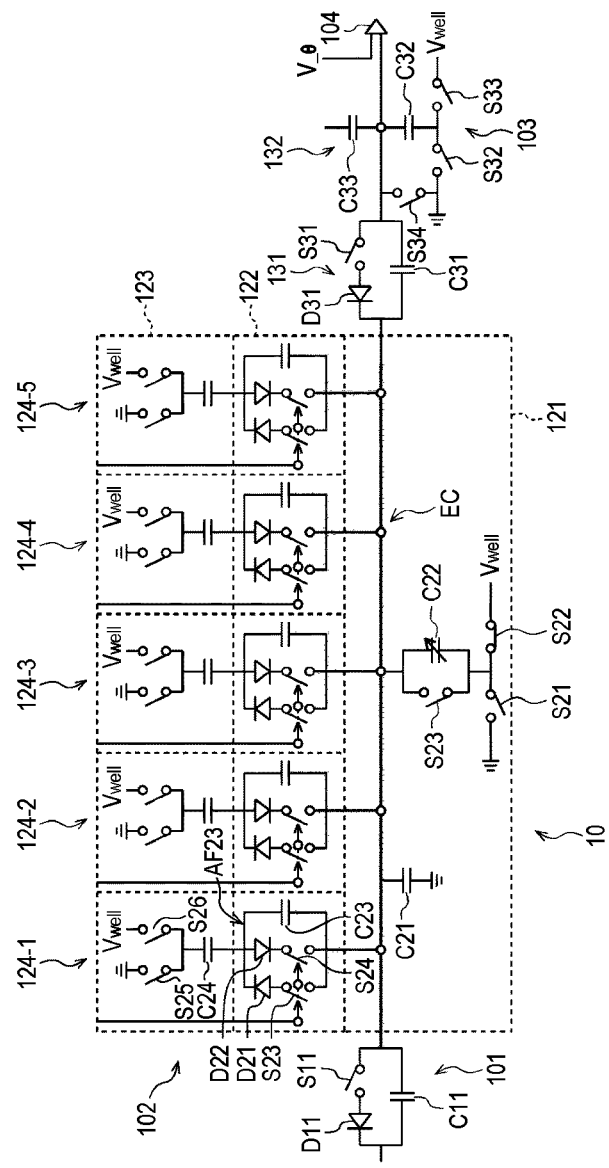
FIG. 9 is a diagram illustrating an example of charge accumulation in the transfer unit of the memory unit in FIG. 7.
Figure 10:
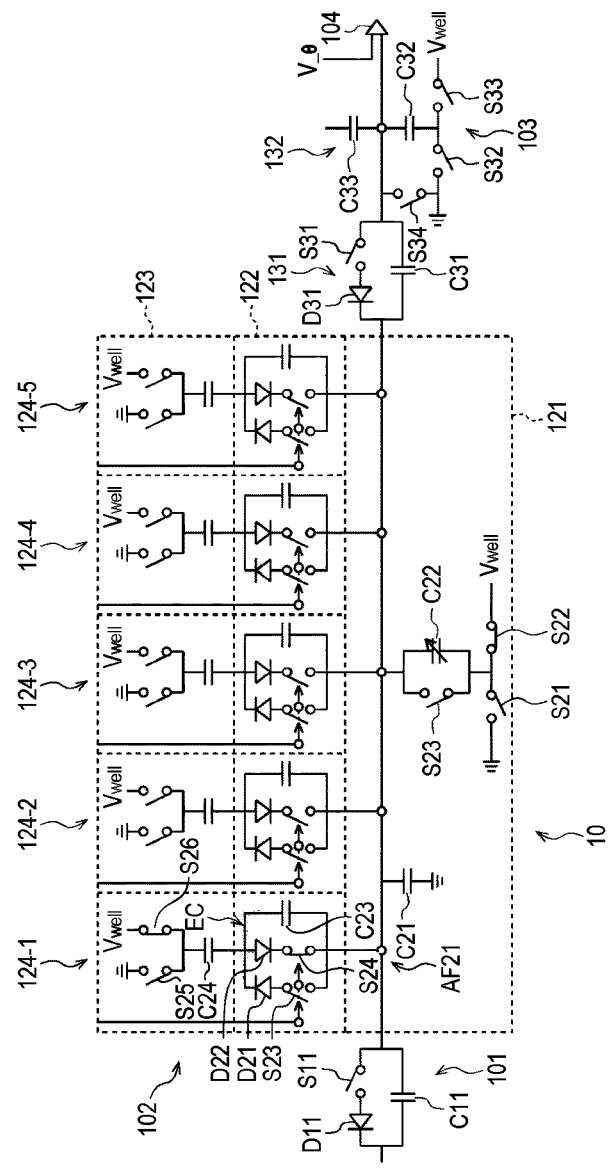
FIG. 10 is a diagram illustrating an example of charge transfer from the transfer unit to the accumulation unit of the memory unit in FIG. 7.

Specific examples of charge accumulation and charge transfer in the transfer unit 121 include those illustrated in FIGS. 8 to 10.

In FIG. 8, in the transfer unit 121, when the switch S22 is turned into an ON state and the switches S21 and S23 are turned into an OFF state, the state transitions from a ground state illustrated in FIG. 7 to a state where charges can be accumulated. That is, in the transfer unit 121, a floating state is formed in the charge accumulation region formation part AF21 by an electric field from outside, and a state where charges can be accumulated is obtained.

In FIG. 9, the transfer unit 121 enters a state where charges can be accumulated, and a state is obtained in which charges from the input unit 101 are accumulated (EC in the figure). Thereafter, in FIG. 10, in the gate unit 122, when the switch S24 is turned into an ON state, charges are transferred from the transfer unit 121 to the accumulation unit 123 (EC in the figure).

As described above, the analog memory device 10 of FIG. 7 includes the input unit 101 that inputs charges, the memory unit 102 that collects and accumulates charges from the input unit 101, and the output unit 103 that detects and outputs charges accumulated in the memory unit 102. Furthermore, the memory unit 102 includes the transfer unit 121 to which a plurality of pairs (the charge holding units 124) of the gate unit 122 and the accumulation unit 123 is connected.

Then, the gate unit 122 selects the accumulation unit 123 that accumulates the charges, the transfer unit 121 transfers charges from the input unit 101 to the accumulation unit 123 selected by the gate unit 122, and the accumulation unit 123 accumulates the charges transferred from the transfer unit 121. Furthermore, the transfer unit 121 transfers charges accumulated in the accumulation unit 123 selected by the gate unit 122, to the output unit 103.

Moreover, the transfer unit 121 and the accumulation unit 123 include the charge accumulation region formation part (AF21, AF23) where a region capable of accumulating charges is formed by an electric field from outside. This charge accumulation region formation part makes it possible to accumulate charges in the transfer unit 121 or transfer charges from the transfer unit 121 to the accumulation unit 123 to accumulate the charges.

Note that, in the above description, a case has been described in which the floating region (F21, F23) or the charge accumulation region formation part (AF21, AF23) is formed in order to realize charge accumulation and charge transfer in the transfer unit 121, but other methods may be used as long as the method can realize charge accumulation and charge transfer. Furthermore, in the above description, the description has been made to the configuration in a case where the five charge holding units 124 are connected to one transfer unit 121 in the analog memory device 10, but the number of charge holding units 124 connected to the transfer unit 121 is not limited to five, and is only required to be plural.

3. Third Embodiment (Structure of Charge Coupling)

FIGS. 11A and 11B are conceptual diagrams illustrating an example of a charge-coupled structure by a transfer electrode unit 121A, a gate electrode unit 122A, and an accumulation electrode unit 123A in the memory unit 102.

In the analog memory device 10 illustrated in FIG. 4 or 7, the transfer unit 121, the gate unit 122, and the accumulation unit 123 constituting the memory unit 102 are respectively paired with the transfer electrode unit 121A, the gate electrode unit 122A, and the accumulation electrode unit 123A, in an electrically non-contact state.

The transfer electrode unit 121A, the gate electrode unit 122A, and the accumulation electrode unit 123A are electrically separated from each other. The transfer electrode unit 121A, the gate electrode unit 122A, and the accumulation electrode unit 123A can apply an influence of an electric field to the transfer unit 121, the gate unit 122, and the accumulation unit 123 that are respectively paired, by individually applying voltages.

Specifically, in FIGS. 11A and 11B, a floating region F21 of the transfer unit 121 can be used as a region (an accumulation region) to accumulate charges by using a structure of charge coupling by applying a voltage Vt1 which is V to the transfer electrode unit 121A to apply the influence of the electric field. Furthermore, by applying a voltage Vt3 which is V to the accumulation electrode unit 123A, a floating region F23 of the accumulation unit 123 can be used as a region to accumulate charges.

Figure 12A:
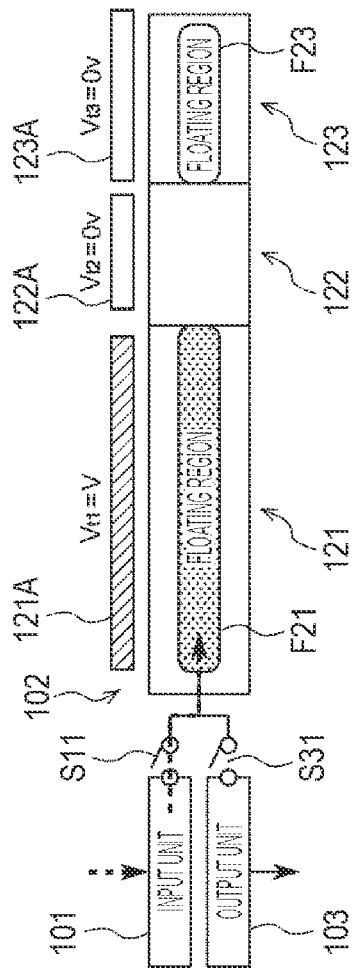
FIGS. 12A and 12B are conceptual diagrams illustrating an example of charge storage using charge coupling.
Figure 12B:
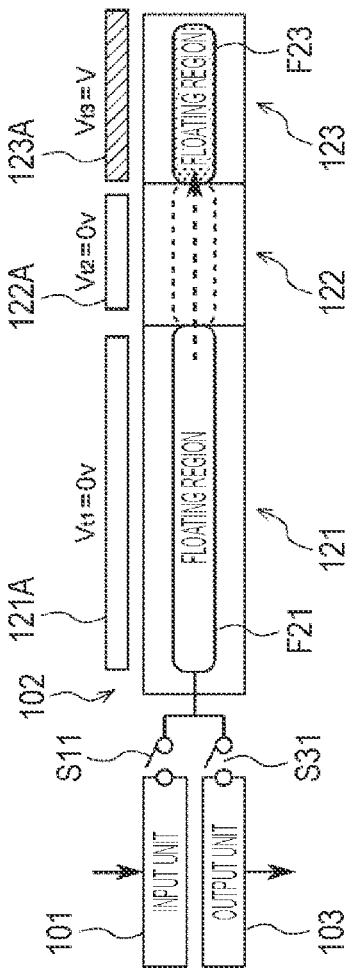

FIGS. 12A and 12B illustrate an example in which, in the structure illustrated in FIGS. 11A and 11B, an operation of individually applying a voltage and an operation of interrupting the voltage are performed on each electrode unit, and charges are stored using charge coupling.

In FIG. 12A, the voltage Vt1 which is V is applied to the transfer electrode unit 121A to generate an electric field in the transfer unit 121, and charges from the input unit 101 are accumulated in the floating region F21 of the transfer unit 121. Thereafter, in FIG. 12B, a voltage Vt3 which is V is applied to the accumulation electrode unit 123A, and charges inputted to the transfer unit 121 are collected, transferred, and accumulated in the floating region F23 of the accumulation unit 123 via the gate unit 122.

As described above, in the memory unit 102, by performing the operation of individually applying a voltage and the operation of interrupting the voltage on the transfer electrode unit 121A, the gate electrode unit 122A, and the accumulation electrode unit 123A, an electric field can be generated or the electric field can be extinguished for each of the transfer unit 121, the gate unit 122, and the accumulation unit 123 that are respectively paired. With such an operation, charges can be accumulated (stored) by collecting and transferring charges inputted from the input unit 101, to the transfer unit 121 of the memory unit 102 in the accumulation unit 123 via the gate unit 122.

Figure 13A:
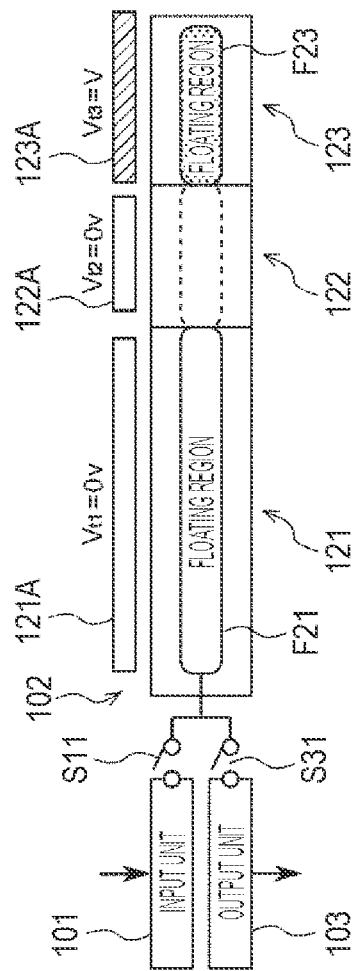
FIGS. 13A and 13B are conceptual diagrams illustrating an example of charge detection using charge coupling.
Figure 13B:
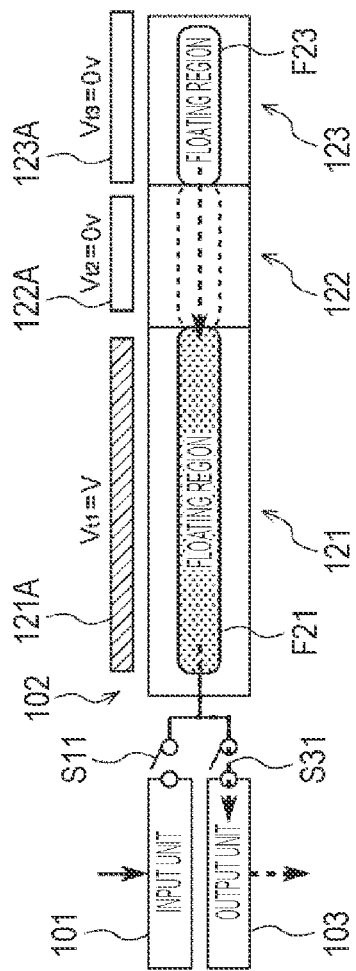
Figure 16A:
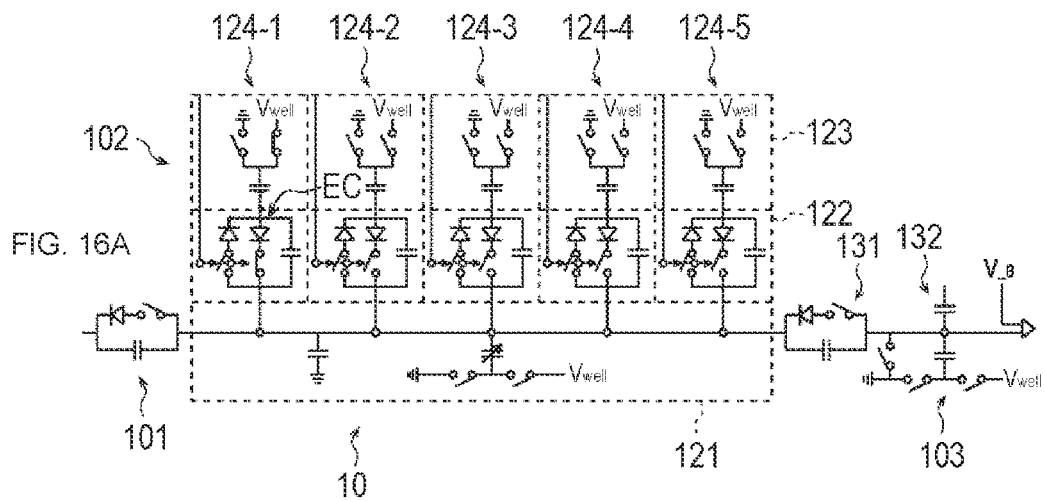
FIGS. 16A and 16B are diagrams illustrating the charge storage procedure by charge coupling in time series.
Figure 16B:
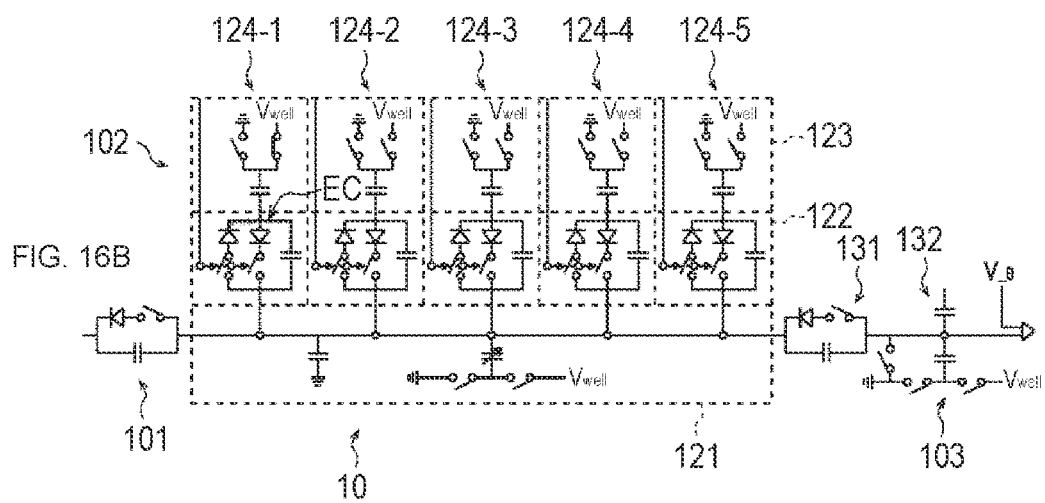

FIGS. 13A and 13B illustrate an example in which, in the structure illustrated in FIGS. 11A and 11B, an operation of individually applying a voltage and an operation of interrupting the voltage are performed on each electrode unit, and charges are detected using charge coupling.

In FIG. 13A, a voltage Vt3 which is V is applied to the accumulation electrode unit 123A, and charges inputted from the input unit 101 are accumulated in the floating region F23 of the accumulation unit 123. Thereafter, in FIG. 13B, a voltage Vt1 which is V is applied to the transfer electrode unit 121A to generate an electric field in the transfer unit 121, and charges accumulated in the accumulation unit 123 are collected and transferred to the output unit 103 via the gate unit 122 and the floating region F21 of the transfer unit 121, and charges are detected.

As described above, in the memory unit 102, by performing the operation of individually applying a voltage and the operation of interrupting the voltage on the transfer electrode unit 121A, the gate electrode unit 122A, and the accumulation electrode unit 123A, an electric field can be generated or the electric field can be extinguished for each of the transfer unit 121, the gate unit 122, and the accumulation unit 123 that are respectively paired. With such an operation, charges accumulated in the accumulation unit 123 of the memory unit 102 can be detected by being collected and transferred to the output unit 103 via the gate unit 122 and the transfer unit 121.

As described above, in the analog memory device 10, the transfer unit 121, the gate unit 122, and the accumulation unit 123 constituting the memory unit 102 include a semiconductor layer, and the floating regions in the transfer unit 121 and the accumulation unit 123 are used by an electric field generated in the transfer unit 121 or the accumulation unit 123 that are respectively paired, by applying a voltage to the transfer electrode unit 121A or the accumulation electrode unit 123A.

Note that, in the structures illustrated in FIGS. 11A, 11B, 12A, 12B, 13A, and 13B, the structure corresponding to the analog memory device 10 in FIG. 4 has been illustrated, but the present invention is similarly applicable to the analog memory device 10 in FIG. 7. That is, in the analog memory device 10 of FIG. 7, by individually applying a voltage to the transfer electrode unit 121A or the accumulation electrode unit 123A, an electric field is generated in the transfer unit 121 or the accumulation unit 123, so that a floating state is formed in the charge accumulation region formation part (AF21, AF23), and charges can be accumulated.

4. Fourth Embodiment (Charge Storage Procedure)

Next, a charge storage procedure by charge coupling in the analog memory device 10 will be described with reference to FIGS. 14A, 14B, 14C, 15A, 15B, 15C, 16A, 16B, 17A, 17B, and 17C. In Fi[ procedure of charge storage by charge coupling is represented in time series in the alphabetical order of A to H. Furthermore, FIGS. 17A, 17B, and 17C conceptually illustrate the procedure of charge storage by charge coupling.

In a structure illustrated in FIGS. 14A, 14B, and 14C, as a method of storing charges in the target accumulation unit 123, first, a voltage is applied to the transfer electrode unit 121A, the gate electrode unit 122A, and the accumulation electrode unit 123A (Procedures B, E, and F), and an electric field is applied to the transfer unit 121, the gate unit 122, and the accumulation unit 123 that are respectively paired (Procedures B, E, and F). Specifically, in FIG. 17A, voltages Vt1, Vt2, and Vt3 which are V are individually applied to the transfer electrode unit 121A, the gate electrode unit 122A, and the accumulation electrode unit 123A, to generate electric fields in the transfer unit 121, the gate unit 122, and the accumulation unit 123.

As a result, the inputted charges are sequentially transported to the transfer unit 121, the gate unit 122, and the accumulation unit 123 (Procedures C to D, Procedures F to G, and Procedure H). Specifically, in FIG. 17B, charges are accumulated in the transfer unit 121, the gate unit 122, and the accumulation unit 123.

Next, the transfer electrode unit 121A and the gate electrode unit 122A interrupts the voltage (Procedures G and H) to extinguish the electric field to the transfer unit 121 and the gate unit 122, and the transferred charges are collected and transferred to the accumulation unit 123 to be accumulated (Procedure H). Specifically, in FIG. 17C, when the voltages Vt1 and Vt2 applied to the transfer electrode unit 121A and the gate electrode unit 122A become 0 V, the electric fields are extinguished, and charges are accumulated in the accumulation unit 123.

(Charge Detection Procedure)

Next, a charge detection procedure by charge coupling in the analog memory device 10 will be described with reference to FIGS. 18A, 18B, 18C, 19A, 19B, 19C, 20A, 20B, and 20C. This charge detection procedure is a procedure of detecting a charge stored by the charge storage procedure described above. In FIGS. 18A, 18B, 18C, 19A, 19B, and 19C, a procedure of charge detection by charge coupling is represented in time series in the alphabetical order of A to F. Furthermore, FIGS. 20A, 20B, and 20C conceptually illustrate the procedure of charge detection by charge coupling.

In the structure illustrated in FIGS. 18A, 18B, and 18C, as a method of transferring charges stored in the accumulation unit 123 from the memory unit 102 to the output unit 103, first, in the accumulation unit 123 in which charges are stored, a voltage is applied to the accumulation electrode unit 123A (Procedure A). Specifically, in FIG. 20A, a voltage Vt3 which is V is applied to the accumulation electrode unit 123A, and charges are accumulated in the accumulation unit 123.

Next, by applying a voltage to the gate electrode unit 122A and the transfer electrode unit 121A (Procedures B and C), charges accumulated in the accumulation unit 123 are sequentially transported to the gate unit 122 and the transfer unit 121 (Procedures B to E). Specifically, in FIG. 20B, the voltages Vt2 and Vt1 which are V are individually applied to the gate electrode unit 122A and the transfer electrode unit 121A together with the accumulation electrode unit 123A to generate electric fields, and charges from the accumulation unit 123 are transported to the gate unit 122 and the transfer unit 121.

Moreover, when a switch of the output unit 103 connected to the transfer unit 121 is turned into an OFF state, and voltages of the accumulation electrode unit 123A, the gate electrode unit 122A, and the transfer electrode unit 121A are interrupted (Procedure F), charges accumulated in the accumulation unit 123 of the memory unit 102 are transferred to the output unit 103 (Procedure F). Specifically, in FIG. 20C, when the voltages Vt3, Vt2, and Vt1 applied to the accumulation electrode unit 123A, the gate electrode unit 122A, and the transfer electrode unit 121A become 0 V, the electric fields are extinguished, and charges are transferred to the output unit 103.

Note that, in the charge storage procedure and the charge detection procedure described above, the configuration corresponding to the analog memory device 10 of FIG. 4 has been described, but the charge storage procedure and the charge detection procedure can be similarly performed in the analog memory device 10 of FIG. 7.

5. Fifth Embodiment

Figures 21A, 21B:
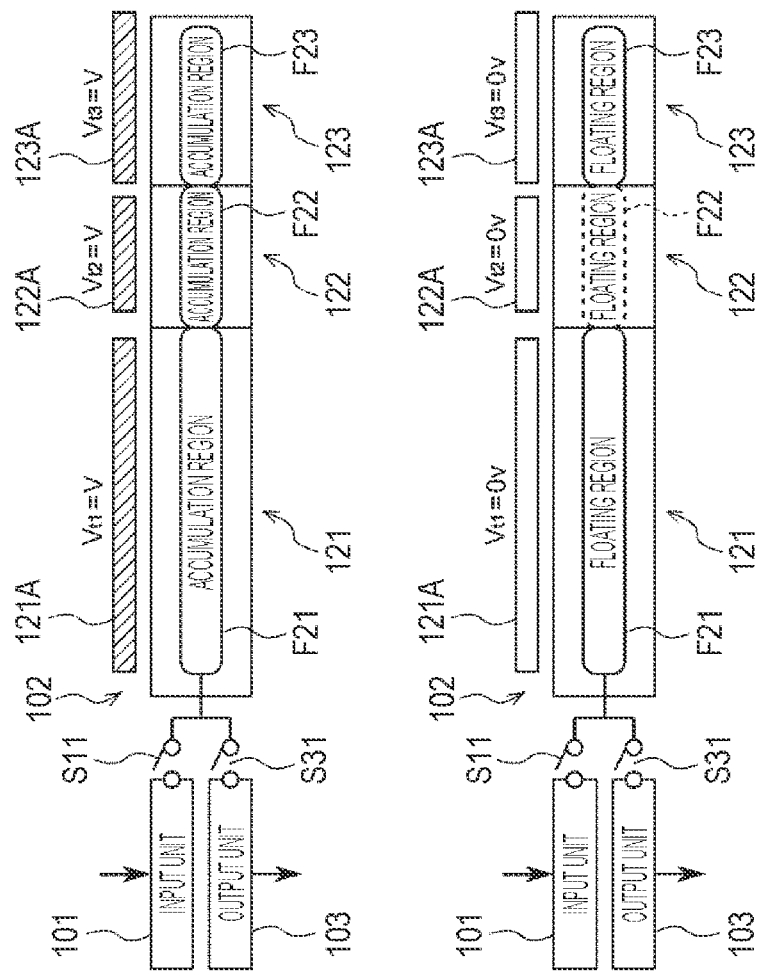
FIGS. 21A and 21B are conceptual diagrams illustrating an example of a configuration of a gate unit of the memory unit.

FIGS. 21A and 21B are conceptual diagrams illustrating an example of a configuration of the gate unit 122 in the memory unit 102.

FIGS. 21A and 21B illustrate a configuration in which the gate unit 122 constituting the memory unit 102 has a floating region F22 that is not in electrical contact from outside of the system and is connected to the floating regions F21 and F23 included in the transfer unit 121 and the accumulation unit 123 in the analog memory device 10 of FIG. 4. In the gate unit 122 of FIGS. 21A and 21B, a voltage Vt2 which is V is applied to the gate electrode unit 122A, so that charges can be accumulated in the floating region F22.

Note that, the analog memory device 10 of FIG. 7 may have a configuration in which the gate unit 122 constituting the memory unit 102 has a charge accumulation region formation part AF22 where a region capable of accumulating charges is formed by an electric field from outside, and is connected to the charge accumulation region formation parts AF21 and AF23 included in the transfer unit 121 and the accumulation unit 123.

6. Sixth Embodiment

Next, with reference to FIGS. 22 to 32, examples of specific structures of the input unit 101, the memory unit 102, and the output unit 103 in the analog memory device 10 will be described.
(Configuration of Memory Unit)

Figure 22:
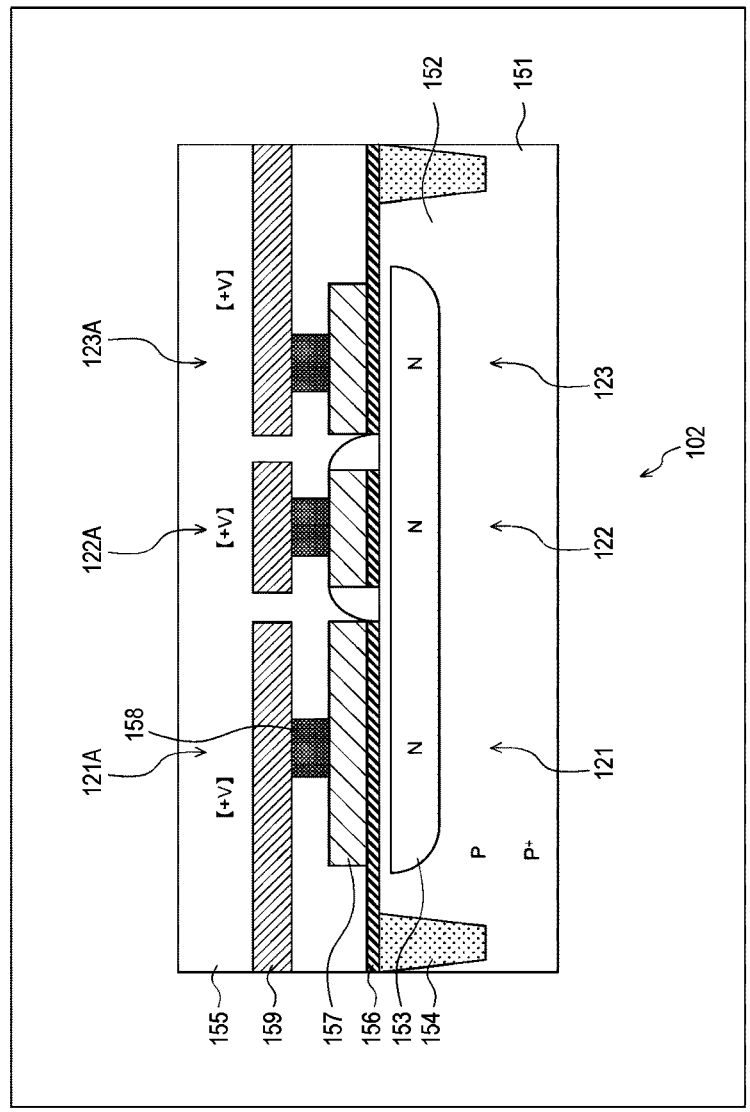
FIG. 22 is a cross-sectional view illustrating a first example of a configuration of the memory unit.

FIG. 22 is a cross-sectional view illustrating a configuration of the memory unit 102.

In a structure in FIG. 22, the transfer unit 121, the gate unit 122, and the accumulation unit 123 constituting the memory unit 102 are individually formed on a silicon semiconductor substrate 151, and an N-type semiconductor layer 153 is formed in a floating state in a P-type semiconductor layer 152.

In the transfer unit 121, the gate unit 122, and the accumulation unit 123, the transfer electrode unit 121A, the gate electrode unit 122A, and the accumulation electrode unit 123A that are respectively paired are formed in an electrically separated state. In each electrode unit, a layer in which a polysilicon (Poly-Si) film 157, a tungsten (W) film 158, and a metal film 159 are layered is formed in an insulating layer 155 such as silicon oxide ($SiO_2$).

The transfer electrode unit 121A, the gate electrode unit 122A, and the accumulation electrode unit 123A have a structure of sandwiching an insulating film 156 such as silicon oxide ($SiO_2$) and the N-type semiconductor layer 153 that is in a floating state and constitutes the transfer unit 121, the gate unit 122, and the accumulation unit 123.

In FIG. 22, the N-type semiconductor layer 153 that is in a floating state and constitutes the transfer unit 121, the gate unit 122, and the accumulation unit 123 is integrally formed. Furthermore, in order to avoid direct contact between a surface layer and the insulating film 156, the N-type semiconductor layer 153 in a floating state is formed with the shallow P-type semiconductor layer 152 between with the surface. Furthermore, in the N-type semiconductor layer 153 in a floating state, the P-type semiconductor layer 152 is formed between shallow trench isolation (STI) 154 embedded in a trench for element isolation, so as to avoid direct contact between the STI 154. For example, the STI 154 is formed by an insulator containing an oxide film.

Figure 23:
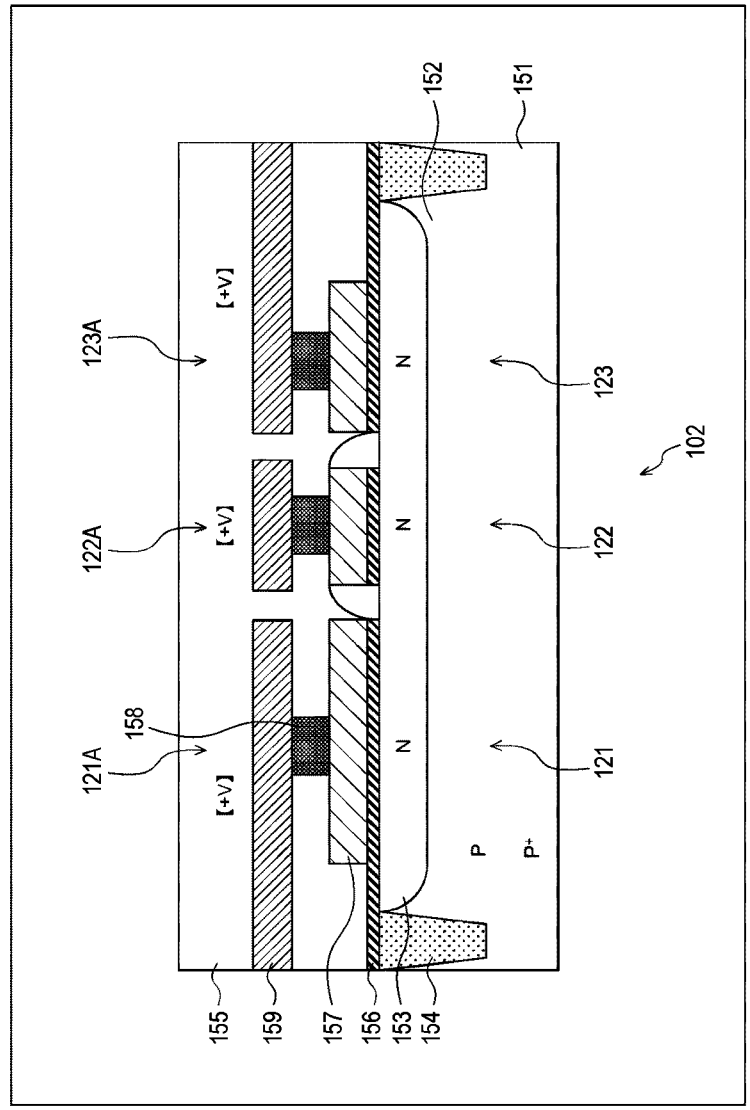
FIG. 23 is a cross-sectional view illustrating a second example of the configuration of the memory unit.

Note that, as illustrated in FIG. 23, a structure may be adopted in which the N-type semiconductor layer 153 and the insulating film 156 are in contact with each other without forming the shallow P-type semiconductor layer 152 between the N-type semiconductor layer 153 and the insulating film 156 in a floating state. Furthermore, as illustrated in FIG. 24, among the transfer unit 121, the gate unit 122, and the accumulation unit 123, the gate unit 122 may have a structure that functions as a switch of a field effect transistor (FET) by an electric field while a region corresponding to the N-type semiconductor layer 153 is not an N layer but a P layer.

Figure 24:
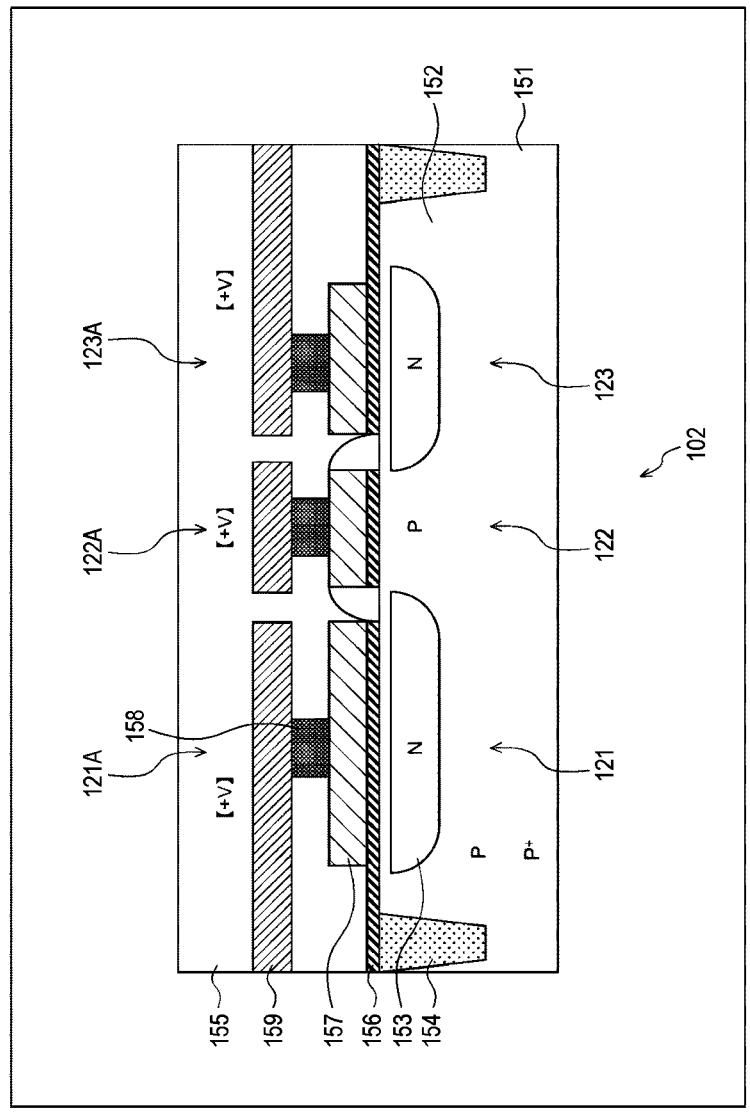
FIG. 24 is a cross-sectional view illustrating a third example of the configuration of the memory unit.

Furthermore, in the structure illustrated in FIGS. 22 to 24, the P layer is preferably higher in impurity concentration than the N layer. Furthermore, most of the N layer may be depleted (a region where carriers corresponding to added impurity concentration are not present by recombination), and desirably, all of the N layer is preferably a depletion layer.
(Configuration of Input Unit)

Figure 25:
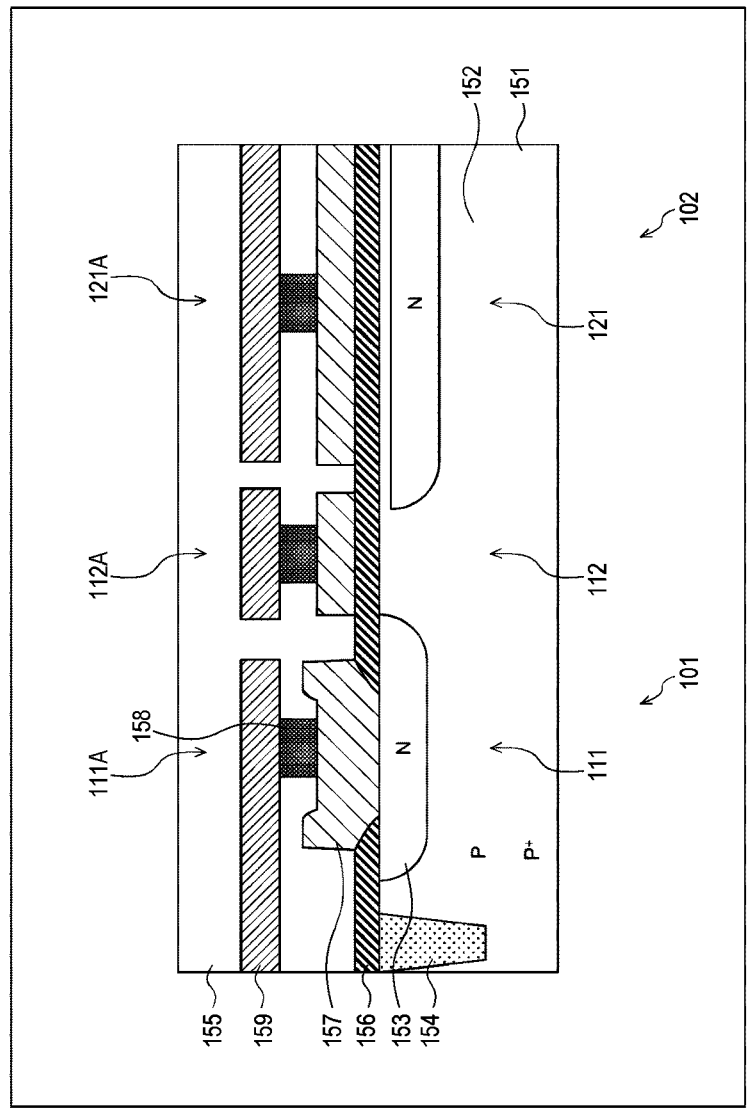
FIG. 25 is a cross-sectional view illustrating a first example of a configuration of an input unit.

FIG. 25 is a cross-sectional view illustrating a configuration of the input unit 101.

In FIG. 25, the input unit 101 has a structure in which an injection unit 111 and an input gate unit 112 are separated. The injection unit 111 and the input gate unit 112 are individually formed on the silicon semiconductor substrate 151. The injection unit 111 has a structure in which the N-type semiconductor layer 153 is formed on a surface portion of the P-type semiconductor layer 152. An electric signal from outside is directly connected to the N layer constituting the injection unit 111 via an input electrode unit 111A.

The input gate unit 112 has a switching function of electrically connecting the injection unit 111 of the input unit 101 and the transfer unit 121 of the memory unit 102. An input gate electrode unit 112A is formed to be paired with the input gate unit 112, and a voltage applied to the input gate electrode unit 112A forms a charge path via an electric field to the input gate unit 112.

In this way, the input unit 101 includes the semiconductor layer, and the input gate unit 112 is provided as a switch unit having a switch function capable of electrically switching between connection and interruption between (the injection unit 111 of) the input unit 101 and the transfer unit 121 of the memory unit 102.

Here, in a case where time-axis analog information is converted into a charge, the charge to be inputted to the transfer unit 121 of the memory unit 102 is set according to a voltage applied to the input gate electrode unit 112A paired with the input gate unit 112 in the input unit 101 and an application time of the voltage.

Figure 26:
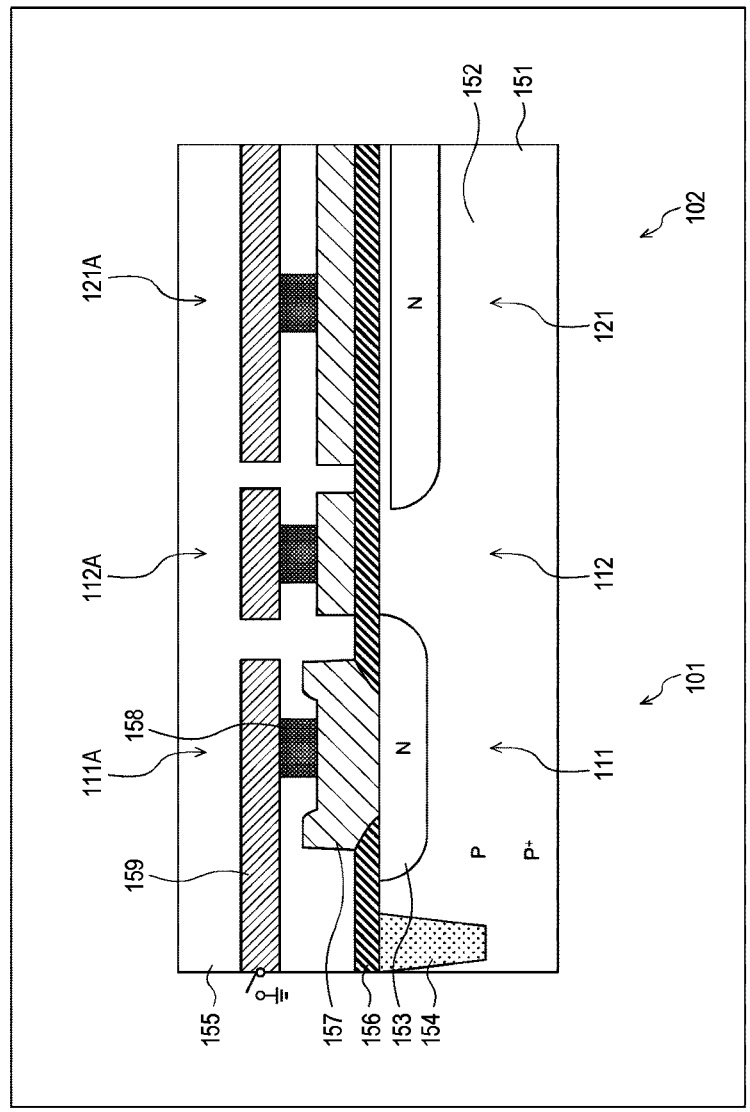
FIG. 26 is a cross-sectional view illustrating a second example of the configuration of the input unit.
Figure 27:
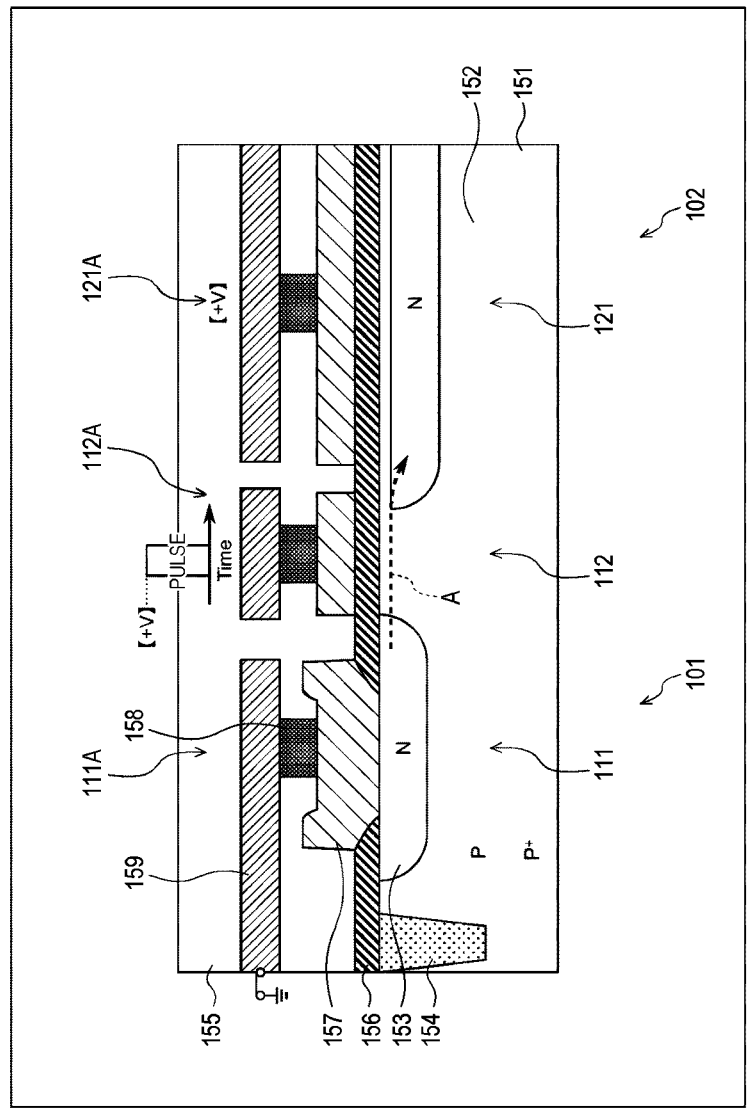
FIG. 27 is a cross-sectional view illustrating a third example of the configuration of the input unit.

FIG. 26 illustrates a state before a voltage is applied to the input gate electrode unit 112A. FIG. 27 illustrates a state where a voltage of +V is applied to the input gate electrode unit 112A for a predetermined time according to a charge inputted to the transfer unit 121, and a charge from the injection unit 111 of the input unit 101 is inputted to the transfer unit 121 of the memory unit 102 (arrow A in the figure).
(Configuration of Output Unit)

Figure 28:
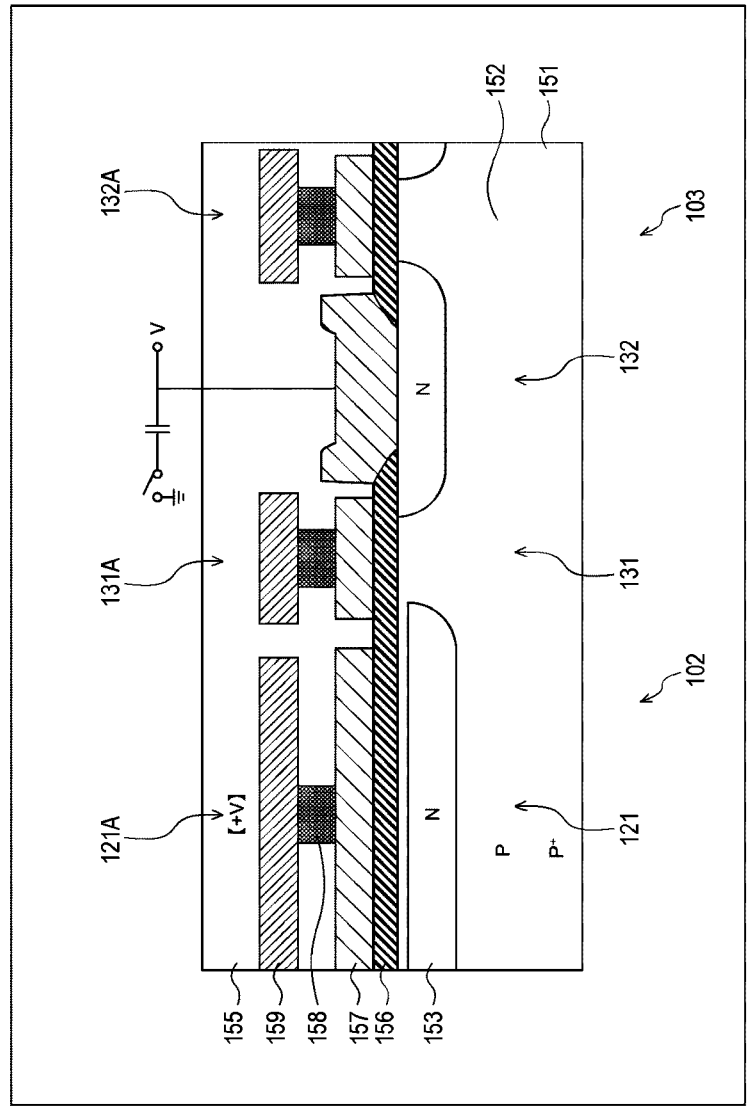
FIG. 28 is a cross-sectional view illustrating a first example of a configuration of an output unit.

FIG. 28 is a cross-sectional view illustrating a configuration of the output unit 103.

In FIG. 28, the output unit 103 has a structure in which the output gate unit 131 and the detection unit 132 are separated. The output gate unit 131 and the detection unit 132 are individually formed on the silicon semiconductor substrate 151. The detection unit 132 has a structure in which the N-type semiconductor layer 153 is formed on a surface portion of the P-type semiconductor layer 152. The N layer constituting the detection unit 132 is directly connected to an output electrode unit 132A that outputs an electric signal to outside, and the N layer and the output electrode unit 132A have a floating structure.

The output gate unit 131 has a switching function of electrically connecting the transfer unit 121 of the memory unit 102 and the detection unit 132 of the output unit 103.

An output gate electrode unit 131A is formed to be paired with the output gate unit 131, and a voltage applied to the output gate electrode unit 131A forms a charge path via an electric field to the output gate unit 131.

In this way, the output unit 103 includes the semiconductor layer, and the output gate unit 131 is provided as a switch unit having a switch function capable of electrically switching between connection and interruption between the transfer unit 121 of the memory unit 102 and (the detection unit 132 of) the output unit 103.

In the output unit 103, when charges accumulated in the accumulation unit 123 of the memory unit 102 are transferred to the detection unit 132 by the electric field of the output gate electrode unit 131A via the transfer unit 121, charges are converted into a voltage detectable by the detection unit 132, and a voltage corresponding to the charges can be detected as a signal.

Figure 29:
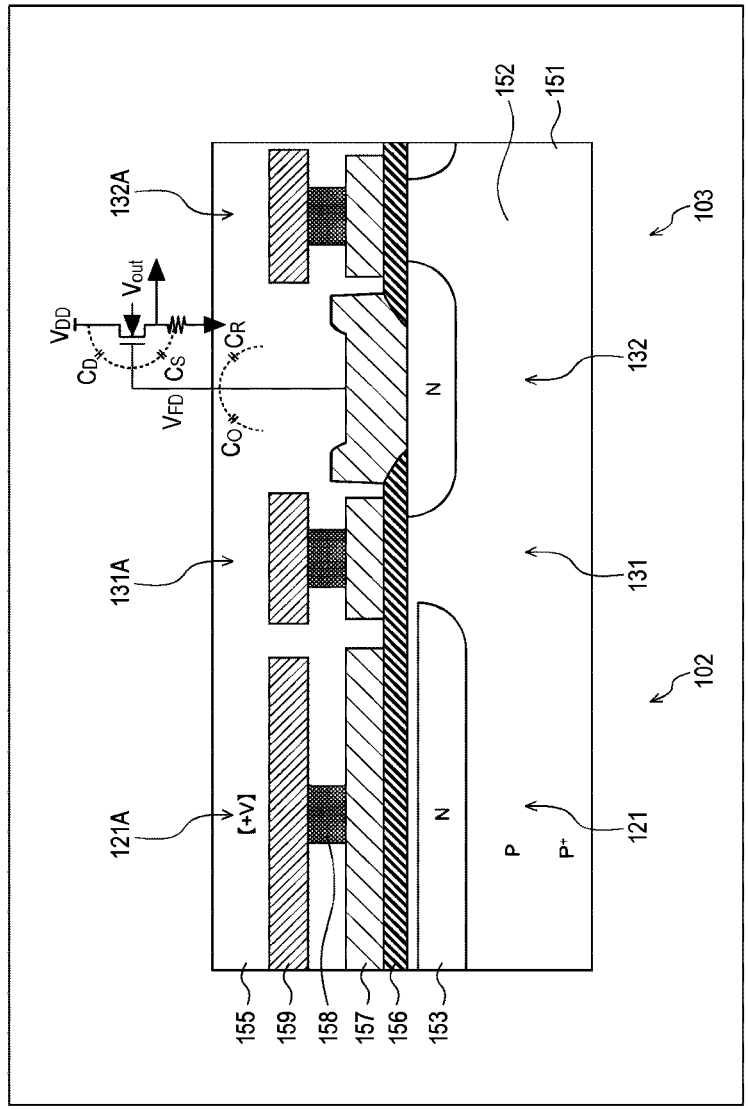
FIG. 29 is a cross-sectional view illustrating a second example of the configuration of the output unit.
Figure 30:
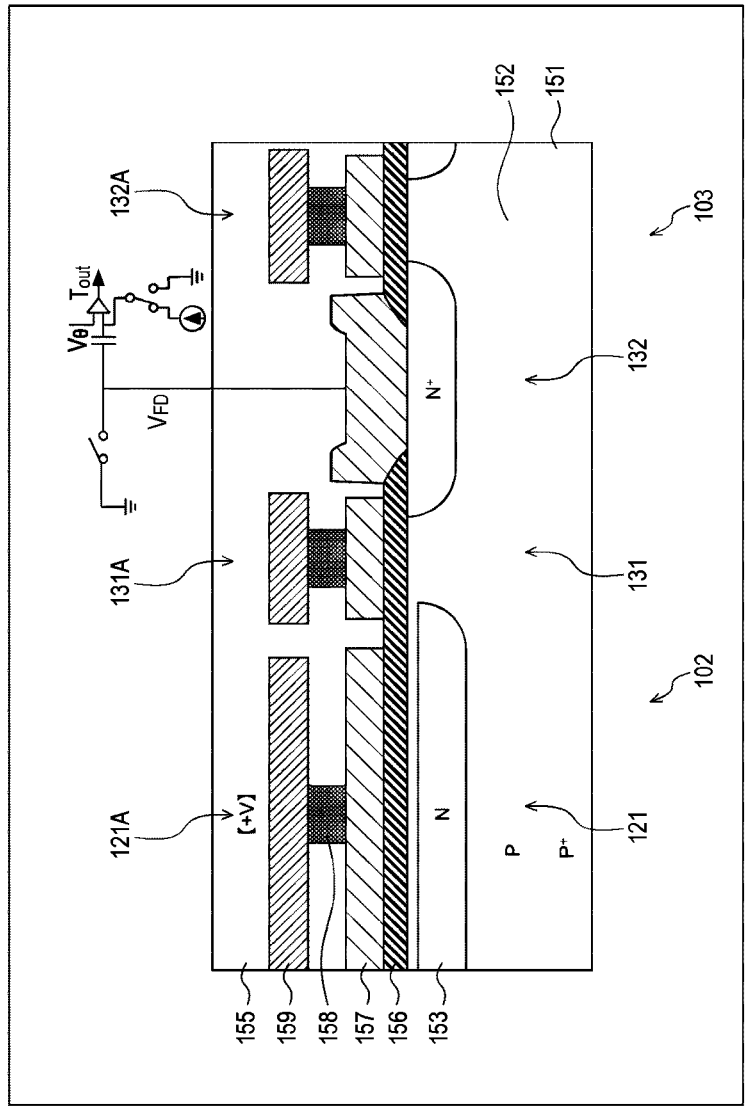
FIG. 30 is a cross-sectional view illustrating a third example of the configuration of the output unit.

Note that an output format from the output unit 103 is not limited to the signal according to the voltage illustrated in FIG. 28, and for example, other output formats may be used as illustrated in FIGS. 29 and 30.

FIG. 29 illustrates a configuration in which a voltage outputted from the output unit 103 is converted into a current to be outputted. Furthermore, FIG. 30 illustrates a configuration in which a voltage outputted from the output unit 103 is compared with any settable threshold voltage Vθ, and a timing is outputted as a pulse width as a time signal. Note that, in the analog memory device 10 in FIG. 4 or 7, a case is exemplified in which the structure illustrated in FIG. 30 is used as a structure of the output unit 103.

(Writing Operation)

Figure 31:
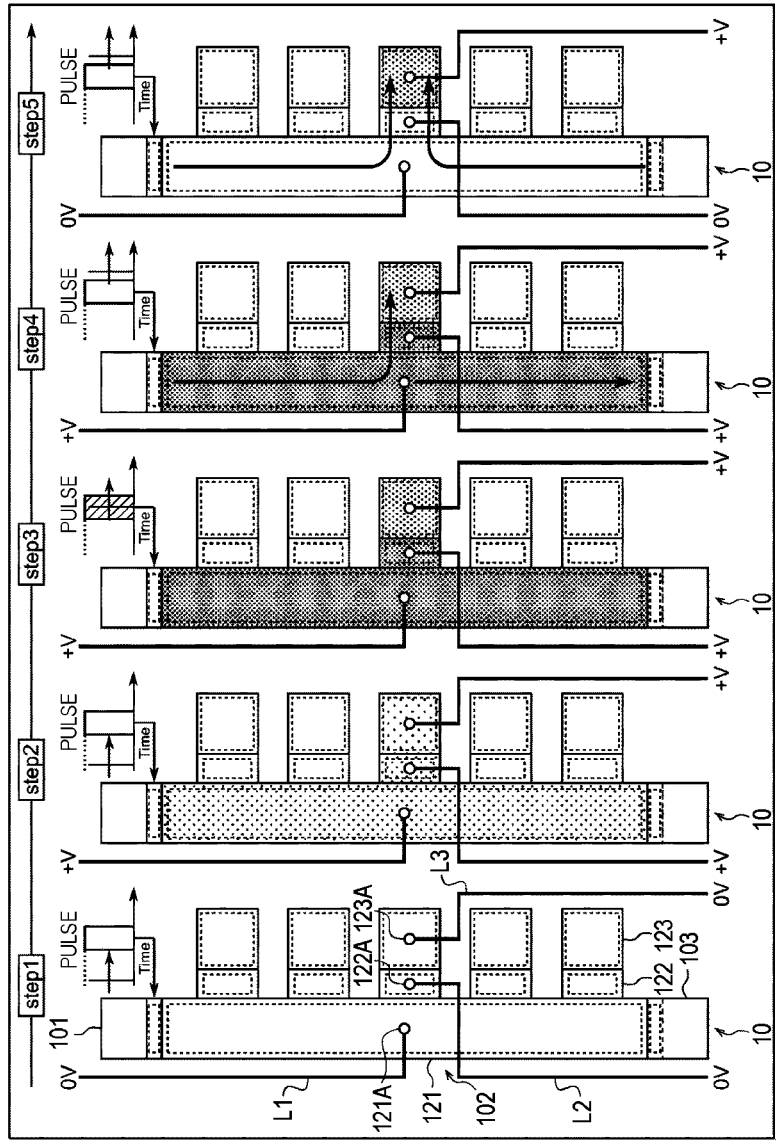
FIG. 31 is a diagram illustrating an example of a charge writing operation of the analog memory device.

FIG. 31 is a diagram illustrating an example of a charge writing operation in the analog memory device 10. FIG. 31 illustrates a series of states in the analog memory device 10 from when a charge of an information amount is inputted from the input unit 101 until the charge is stored in the accumulation unit 123 of the memory unit 102, in time series in steps 1 to 5.

In the memory unit 102, the transfer electrode unit 121A paired with the transfer unit 121 is connected to a signal line L1, the gate electrode unit 122A paired with the gate unit 122 is connected to a signal line L2, and the accumulation electrode unit 123A paired with the accumulation unit 123 is connected to a signal line L3. To the signal lines L1 to L3, a voltage is applied in accordance with a charge writing operation.

When the state shifts from step 1 to step 2, a voltage V is applied to each of the transfer electrode unit 121A, the gate electrode unit 122A, and the accumulation electrode unit 123A. As a result, in the state of steps 2 to 4, an electric field is generated in the transfer unit 121, the gate unit 122, and the accumulation unit 123, and charges inputted from the input unit 101 are sequentially transported to the transfer unit 121, the gate unit 122, and the accumulation unit 123.

When the state shifts from step 4 to step 5, voltages applied to the transfer electrode unit 121A and the gate electrode unit 122A change from V to 0. As a result, in the state of step 5, charges from the input unit 101 are collected, transferred, and accumulated in the accumulation unit 123.

(Reading Operation)

Figure 32:
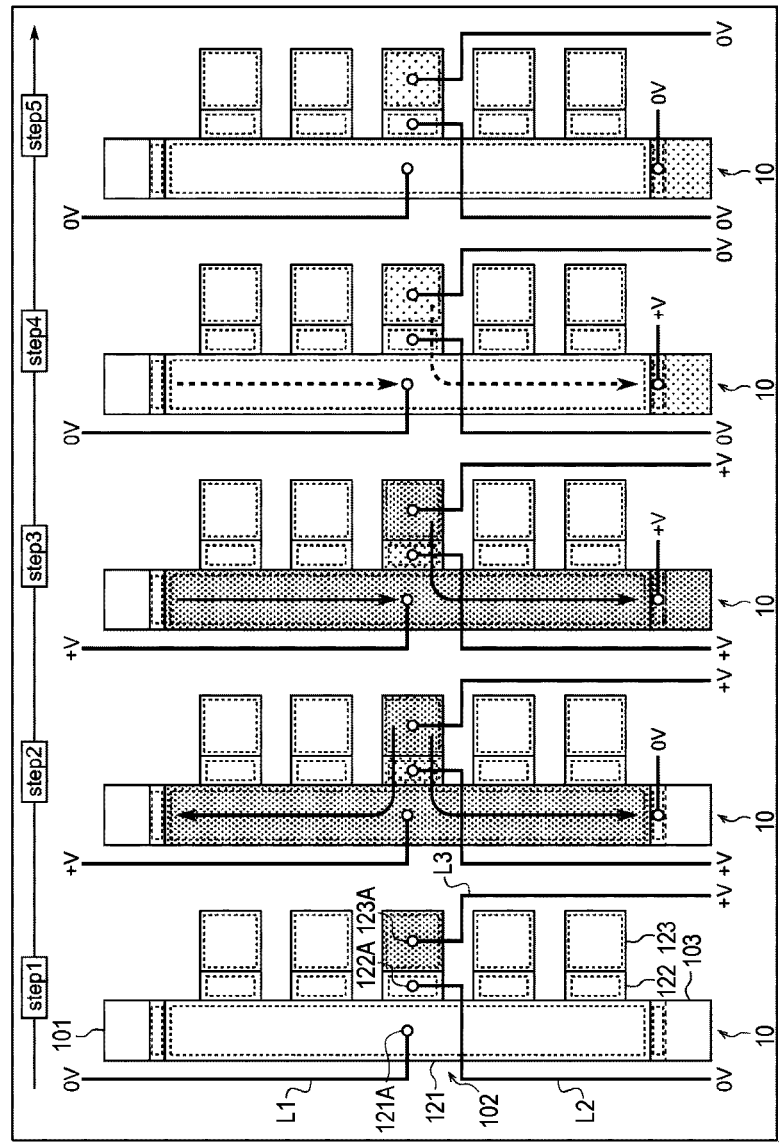
FIG. 32 is a diagram illustrating an example of a charge reading operation of the analog memory device.

FIG. 32 is a diagram illustrating an example of a charge reading operation in the analog memory device 10. FIG. 32 illustrates a series of states in the analog memory device 10 from when a charge of the information amount is read from the accumulation unit 123 of the memory unit 102 until the charge is transferred to the detection unit 132 of the output unit 103, in time series in steps 1 to 5.

In the state of step 1, a voltage of V is applied to the accumulation electrode unit 123A, and charges are accumulated in the accumulation unit 123. That is, the state of step 1 in FIG. 32 corresponds to the state of step 5 in FIG. 31.

When the state shifts from step 1 to step 2, voltages applied to the gate electrode unit 122A and the transfer electrode unit 121A change from 0 to V. As a result, in the state of steps 2 to 3, charges from the accumulation unit 123 are transported to the gate unit 122 and the transfer unit 121, and further transported to the output unit 103.

When the state shifts from step 3 to step 4, voltages applied to the accumulation electrode unit 123A, the gate electrode unit 122A, and the transfer electrode unit 121A change from V to 0. As a result, in the states of steps 4 to 5, charges from the accumulation unit 123 are transferred to the output unit 103.

7. Seventh Embodiment (Array System Configuration)

Figure 33:
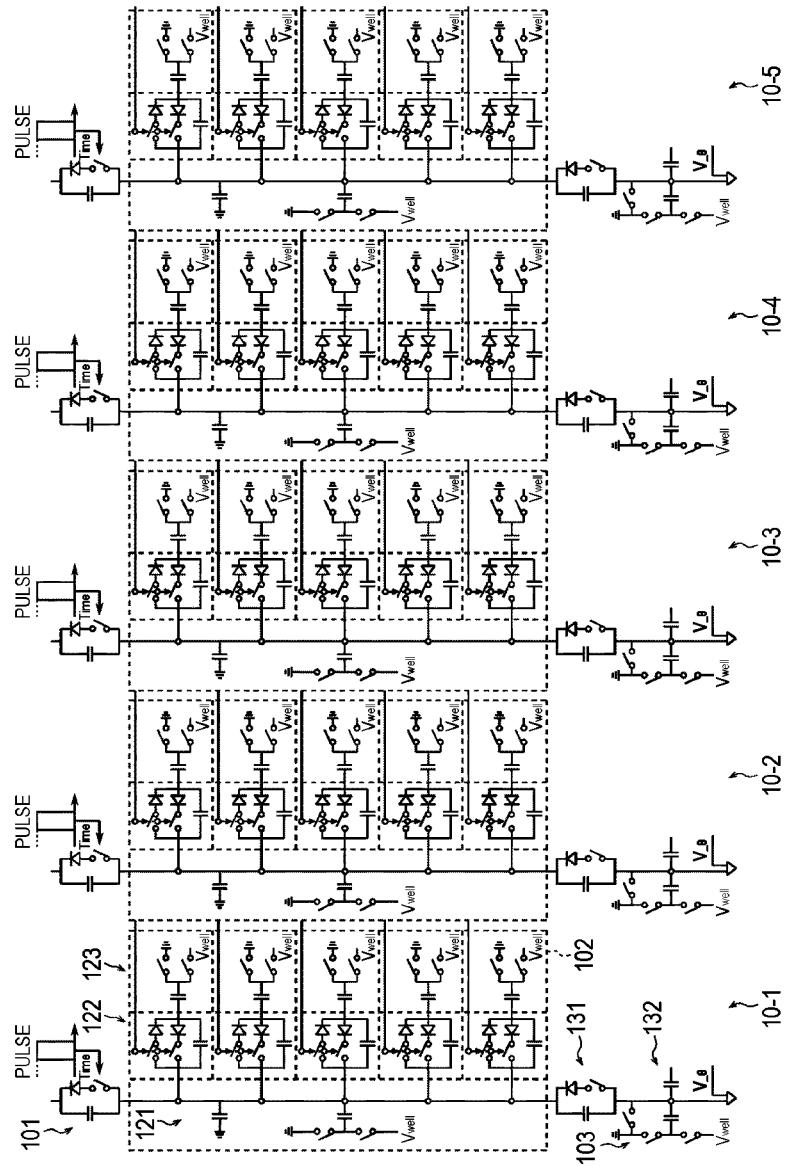
FIG. 33 is a circuit diagram illustrating a configuration of an analog memory array system.

FIG. 33 is a circuit diagram illustrating a configuration of an analog memory array system to which the present technology is applied.

In FIG. 33, the analog memory array system has a configuration in which a plurality of analog memory devices 10 is arranged in an array. In the analog memory array system of FIG. 33, analog memory devices 10-1 to 10-5 are arranged in parallel, and gate electrode units 122A individually paired with gate units 122 of memory units 102 are electrically connected to each other between the analog memory devices 10-1 to 10-5.

Figure 34:
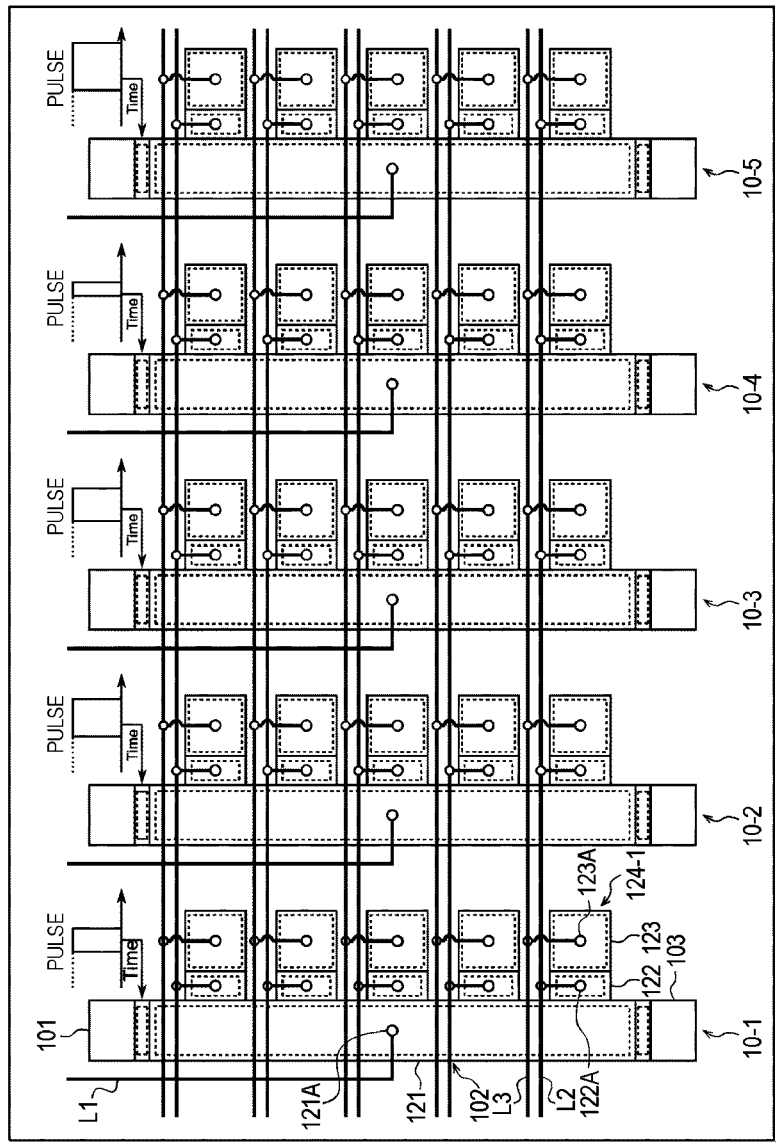
FIG. 34 is a diagram illustrating a configuration of the analog memory array system.

Specifically, as illustrated in FIG. 34, in the analog memory devices 10-1 to 10-5 each, charge holding units 124-1 to 124-5 are connected to transfer units 121. In the analog memory devices 10-1 to 10-5 arranged in parallel, each of gate electrode units 122A paired with the gate units 122 of the charge holding units 124 arranged in the same row in a lateral direction are electrically connected by a signal line L2.

As a result, in the analog memory array system, by controlling a voltage applied to the signal line L2, each of the gate electrode units 122A connected to the same signal line L2 can be controlled in common in the analog memory devices 10-1 to 10-5.

Furthermore, in each analog memory device 10, in the memory unit 102, the transfer electrode unit 121A paired with the transfer unit 121 is connected to a signal line L1, and an accumulation electrode unit 123A paired with an accumulation unit 123 is connected to a signal line L3, and the transfer electrode unit 121A and the accumulation electrode unit 123A are controlled by applying a voltage to the signal lines L1 and L3.

Note that, in the analog memory array system of FIGS. 33 and 34, a configuration in a case where the five analog memory devices 10 are arranged in parallel is illustrated, but the number of the analog memory devices 10 arranged in parallel is not limited to five, and is only required to be plural. Furthermore, in each analog memory device 10, a configuration in a case where the five charge holding units 124 are connected to the transfer unit 121 has been described, but the number of charge holding units 124 is not limited to five, and is only required to be plural.

8. Eighth Embodiment

Figure 35:
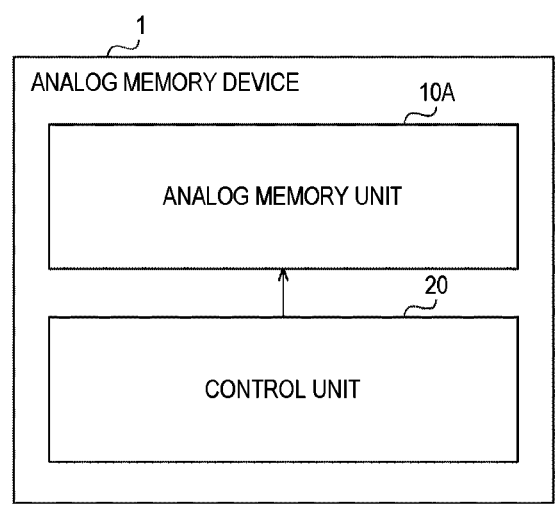
FIG. 35 is a block diagram illustrating an example of a configuration of an embodiment of a configuration of a semiconductor device to which the present technology is applied.

FIG. 35 is a diagram illustrating an example of a configuration of an embodiment of a configuration of a semiconductor device to which the present technology is applied.

An analog memory device 1 is an example of a semiconductor device. The analog memory device 1 includes an analog memory unit 10A and a control unit 20. The analog memory unit 10A has a configuration corresponding to the analog memory device 10 illustrated in FIG. 4 or 7. Furthermore, the analog memory unit 10A may have a configuration corresponding to the analog memory array system illustrated in FIG. 33.

The control unit 20 includes a processor and the like, and controls an operation of the analog memory unit 10A. For example, the control unit 20 controls voltages applied to each electrode unit at the time of a charge writing operation or a charge reading operation performed in the analog memory unit 10A.

Note that FIG. 35 illustrates a configuration in which the control unit 20 is provided inside the analog memory device 1, but the control unit 20 may be provided in an external device (not illustrated). In a case where the control unit 20 is provided in the external device, a control signal from (the control unit 20 of) the external device is inputted to (the analog memory unit 10A of) the analog memory device 1 via a predetermined interface.

As described above, in the analog memory device 10 to which the present technology is applied, since the memory unit 102 has the configuration including the transfer unit 121 to which a plurality of pairs (the charge holding units 124) of the gate unit 122 and the accumulation unit 123 is connected, it is possible to suppress waste of energy consumption at the time of the operation.

In particular, while energy consumption is greatly wasted by charging and discharging of wiring of a phase difference clock line by a repeated voltage in the technology disclosed in Patent Document 1 described above, it is not necessary to perform such charging and discharging in the analog memory device 10 to which the present technology is applied, so that waste of energy consumption can be suppressed.

Furthermore, in the analog memory device 10 to which the present technology is applied, a configuration is adopted in which charges as an information amount are directly stored as analog values in the memory unit 102. Therefore, waste of energy consumption can be suppressed by reducing energy consumption more than the parasitic capacitance parasitic in the wiring. Note that, by detailed simulation by the inventors of the present technology, it has been confirmed that the analog memory device 10 to which the present technology is applied can obtain an effect related to energy consumption as compared with a semiconductor memory system such as an SRAM.

Here, in an analog computation system using a device as a computation element, and a system that detects an analog value and stores data thereof, a digital memory system such as an SRAM is most often adopted. These digital memory systems perform extremely inefficient and complicated processing such as performing analog-to-digital converter (ADC) on an analog value of a computation value or a detection value and storing the analog value in a digital memory, reading from the digital memory as necessary, and performing digital-to-analog converter (DAC) and repeatedly processing analog computation.

Such a digital memory system occupies a large proportion of an entire energy consumption ratio of the analog computation system or an analog sensing system, and reduction of this enormous energy consumption in a memory section is an important problem. In the analog memory device 10 to which the present technology is applied, a potential well by a charge coupling method is formed using an information amount of analog computation as a charge, and a plurality of potential wells is formed in a transfer potential well as a method for efficiently transferring and storing (accumulating) charges, to realize a storage function as an analog memory and a write and read function.

Note that the embodiment of the present technology is not limited to the above-described embodiment, and various modifications can be made without departing from the scope of the present technology.

In this specification, a system means a set of a plurality of components (devices, elements, modules (parts), and the like). Furthermore, in this specification, the "charge" includes the meaning of a charge amount that is an amount of charge, and the "charge" may be read as the "charge amount". Furthermore, the effects described in this specification are merely examples and are not limited, and other effects may be present.

Note that the present disclosure can have the following configurations.

(1)

A semiconductor device including:

an input unit configured to input a charge;

a memory unit configured to collect and accumulate a charge from the input unit; and an output unit configured to detect and output a charge accumulated in the memory unit, in which the memory unit includes a transfer unit to which a plurality of pairs of a gate unit and an accumulation unit is connected, and the gate unit selects the accumulation unit that accumulates a charge, the transfer unit transfers a charge from the input unit to the accumulation unit selected by the gate unit, the accumulation unit accumulates a charge transferred from the transfer unit, and the transfer unit transfers a charge accumulated in the accumulation unit selected by the gate unit, to the output unit.

(2)

The semiconductor device according to (1) above, in which the transfer unit and the accumulation unit include a floating region that is not in electrical contact from outside.

(3)

The semiconductor device according to (1) above, in which the transfer unit and the accumulation unit include a charge accumulation region formation part where a region capable of accumulating a charge is formed by an electric field from outside.

(4)

The semiconductor device according to any one of (1) to (3), in which a transfer electrode unit, a gate electrode unit, and an accumulation electrode unit are respectively paired with the transfer unit, the gate unit, and the accumulation unit in an electrically non-contact state, and the transfer electrode unit, the gate electrode unit, and the accumulation electrode unit are electrically separated from each other, and by applying a voltage individually to the transfer electrode unit, the gate electrode unit, and the accumulation electrode unit, an influence of an electric field is applied to the transfer unit, the gate unit, and the accumulation unit that are respectively paired with the transfer electrode unit, the gate electrode unit, and the accumulation electrode unit.

(5)

The semiconductor device according to (4) above, in which
 a charge inputted from the input unit to the transfer unit is transferred to the accumulation unit via the gate unit and accumulated, by performing an operation of individually applying a voltage to the transfer electrode unit, the gate electrode unit, and the accumulation electrode unit and an operation of interrupting the voltage, to generate an electric field or extinguish an electric field in each of the transfer unit, the gate unit, and the accumulation unit that are respectively paired with the transfer electrode unit, the gate electrode unit, and the accumulation electrode unit.

(6)

The semiconductor device according to (4) or (5) above, in which
 a charge accumulated in the accumulation unit is transferred from the transfer unit to the output unit via the gate unit and detected, by performing an operation of individually applying a voltage to the transfer electrode unit, the gate electrode unit, and the accumulation electrode unit and an operation of interrupting the voltage, to generate an electric field or extinguish an electric field in each of the transfer unit, the gate unit, and the accumulation unit that are respectively paired with the transfer electrode unit, the gate electrode unit, and the accumulation electrode unit.

(7)

The semiconductor device according to (4) or (5) above, in which
 a charge inputted from the input unit is transported in order of the transfer unit, the gate unit, and the accumulation unit, by applying a voltage to the transfer electrode unit, the gate electrode unit, and the accumulation electrode unit to apply an electric field to the transfer unit, the gate unit, and the accumulation unit that are respectively paired with the transfer electrode unit, the gate electrode unit, and the accumulation electrode unit, and
 a charge transferred to the accumulation unit is accumulated, by interrupting a voltage of the transfer electrode unit and the gate electrode unit to extinguish an electric field to the transfer unit and the gate unit that are respectively paired with the transfer electrode unit and the gate electrode unit.

(8)

The semiconductor device according to (4) or (6) above, in which
 a charge accumulated in the accumulation unit is transported in order of the gate unit and the transfer unit, by applying a voltage to the accumulation electrode unit paired with the accumulation unit that has accumulated a charge and applying a voltage to the gate electrode unit and the transfer electrode unit to apply an electric field to the gate unit and the transfer unit that are respectively paired with the gate electrode unit and the transfer electrode unit, and
 a charge accumulated in the accumulation unit is transferred to the output unit, by transporting a charge from the transfer unit to the output unit, and interrupting a voltage of the accumulation electrode unit, the gate electrode unit, and the transfer electrode unit to extinguish an electric field to the accumulation unit, the gate unit, and the transfer unit that are respectively paired with the accumulation electrode unit, the gate electrode unit, and the transfer electrode unit.

(9)

The semiconductor device according to any one of (1) to (8), in which
 the gate unit includes a floating region that is not in electrical contact from outside, or a charge accumulation region formation part where a region capable of accumulating a charge is formed by an electric field from outside.

(10)

The semiconductor device according to (9) above, in which
 the floating region or the charge accumulation region formation part is connected to a floating region included in the transfer unit and the accumulation unit.

(11)

The semiconductor device according to any one of (4) to (8), in which
 the transfer unit, the gate unit, and the accumulation unit include a semiconductor layer, and
 a floating region in the transfer unit and the accumulation unit is formed by an electric field generated in the transfer unit or the accumulation unit respectively paired with the transfer electrode unit or the accumulation electrode unit, by applying a voltage to the transfer electrode unit or the accumulation electrode unit.

(12)

The semiconductor device according to any one of (1) to (11), further including:
 a switch unit capable of electrically switching between connection and interruption between the input unit and the transfer unit of the memory unit.

(13)

The semiconductor device according to (12) above, in which
 the input unit includes a semiconductor layer, and
 the switch unit is formed in the semiconductor layer.

(14)

The semiconductor device according to any one of (1) to (13), further including:
 a switch unit capable of electrically switching between connection and interruption between the output unit and the transfer unit of the memory unit.

(15)

The semiconductor device according to (14) above, in which
 the output unit includes a semiconductor layer, and
 the switch unit is formed in the semiconductor layer.

(16)

The semiconductor device according to any one of (1) to (15), in which
 the semiconductor device is configured as an analog memory device.

(17)

The semiconductor device according to (16) above, in which
 the semiconductor device is configured as an analog memory array system having an array-shape and including a plurality of the analog memory devices arranged in parallel.

(18)
The semiconductor device according to (17) above, in which
 in the analog memory array system, gate electrode units individually paired with gate units are electrically connected to each other between the analog memory devices arranged in parallel.

REFERENCE SIGNS LIST 1, 10 Analog memory device
10A Analog memory unit
20 Control unit
101 Input unit
102 Memory unit
103 Output unit
104 Comparison unit
111 Injection unit
111A Input electrode unit
112 Input gate unit
112A Input gate electrode unit
121 Transfer unit
121A Transfer electrode unit
122 Gate unit
122A Gate electrode unit
123 Accumulation unit
123A Accumulation electrode unit
131 Output gate unit
131A Output gate electrode unit
132 Detection unit
132A Output electrode unit

The invention claimed is:

1. A semiconductor device, comprising:
an input unit configured to input a charge;
a memory unit configured to collect and accumulate a charge from the input unit; and
an output unit configured to detect and output a charge accumulated in the memory unit, wherein
the memory unit includes a transfer unit to which a plurality of pairs of a gate unit and an accumulation unit is connected,
the gate unit is configured to select the accumulation unit that accumulates a charge,
the transfer unit is configured to transfer a charge from the input unit to the accumulation unit selected by the gate unit,
the accumulation unit is configured to accumulate a charge transferred from the transfer unit, and
the transfer unit is further configured to transfers a charge accumulated in the accumulation unit selected by the gate unit, to the output unit.

2. The semiconductor device according to claim 1, wherein
the transfer unit and the accumulation unit include a floating region that is not in electrical contact from outside.

3. The semiconductor device according to claim 1, wherein
the transfer unit and the accumulation unit include a charge accumulation region formation part where a region capable of accumulating a charge is formed by an electric field from outside.

4. The semiconductor device according to claim 1, wherein
a transfer electrode unit, a gate electrode unit, and an accumulation electrode unit are respectively paired with the transfer unit, the gate unit, and the accumulation unit in an electrically non-contact state,
the transfer electrode unit, the gate electrode unit, and the accumulation electrode unit are electrically separated from each other,
by applying a voltage individually to the transfer electrode unit, the gate electrode unit, and the accumulation electrode unit, an influence of an electric field is applied to the transfer unit, the gate unit, and the accumulation unit, and
the transfer unit, the gate unit, and the accumulation unit are respectively paired with the transfer electrode unit, the gate electrode unit, and the accumulation electrode unit.

5. The semiconductor device according to claim 4, wherein
a charge inputted from the input unit to the transfer unit is transferred to the accumulation unit via the gate unit and accumulated, based on an operation to individually apply a voltage to the transfer electrode unit, the gate electrode unit, and the accumulation electrode unit and an operation to interrupt the voltage, to generate an electric field or extinguish an electric field in each of the transfer unit, the gate unit, and the accumulation unit, and
the transfer unit, the gate unit, and the accumulation unit are respectively paired with the transfer electrode unit, the gate electrode unit, and the accumulation electrode unit.

6. The semiconductor device according to claim 4, wherein
a charge accumulated in the accumulation unit is transferred from the transfer unit to the output unit via the gate unit and detected, based on an operation to individually apply a voltage to the transfer electrode unit, the gate electrode unit, and the accumulation electrode unit and an operation to interrupt the voltage, to generate an electric field or extinguish an electric field in each of the transfer unit, the gate unit, and the accumulation unit, and
the transfer unit, the gate unit, and the accumulation unit are respectively paired with the transfer electrode unit, the gate electrode unit, and the accumulation electrode unit.

7. The semiconductor device according to claim 4, wherein
a charge inputted from the input unit is transported in order of the transfer unit, the gate unit, and the accumulation unit, based on an application of a voltage to the transfer electrode unit, the gate electrode unit, and the accumulation electrode unit to apply an electric field to the transfer unit, the gate unit, and the accumulation unit,
the transfer unit, the gate unit, and the accumulation unit are respectively paired with the transfer electrode unit, the gate electrode unit, and the accumulation electrode unit, and
a charge transferred to the accumulation unit is accumulated, based on an interruption of a voltage of the transfer electrode unit and the gate electrode unit to extinguish an electric field to the transfer unit and the gate unit that are respectively paired with the transfer electrode unit and the gate electrode unit.

8. The semiconductor device according to claim 4, wherein
a charge accumulated in the accumulation unit is transported in order of the gate unit and the transfer unit, based on an application of a voltage to the accumulation electrode unit paired with the accumulation unit that has accumulated a charge and an application of a voltage to the gate electrode unit and the transfer electrode unit to apply an electric field to the gate unit and the transfer unit that are respectively paired with the gate electrode unit and the transfer electrode unit, and a charge accumulated in the accumulation unit is transferred to the output unit, based on a transportation of a charge from the transfer unit to the output unit, and an interruption of a voltage of the accumulation electrode unit, the gate electrode unit, and the transfer electrode unit to extinguish an electric field to the accumulation unit, the gate unit, and the transfer unit that are respectively paired with the accumulation electrode unit, the gate electrode unit, and the transfer electrode unit.

9. The semiconductor device according to claim 1, wherein the gate unit includes a floating region that is not in electrical contact from outside, or a charge accumulation region formation part where a region accumulates a charge is formed by an electric field from outside.

10. The semiconductor device according to claim 9, wherein the floating region or the charge accumulation region formation part is connected to a floating region included in the transfer unit and the accumulation unit.

11. The semiconductor device according to claim 4, wherein the transfer unit, the gate unit, and the accumulation unit include a semiconductor layer, and a floating region in the transfer unit and the accumulation unit is formed by an electric field generated in the transfer unit or the accumulation unit respectively paired with the transfer electrode unit or the accumulation electrode unit based on an application of a voltage to the transfer electrode unit or the accumulation electrode unit.

12. The semiconductor device according to claim 1, further comprising:

a switch unit configured to switch between connection and interruption between the input unit and the transfer unit of the memory unit.

13. The semiconductor device according to claim 12, wherein the input unit includes a semiconductor layer, and
the switch unit is in the semiconductor layer.

14. The semiconductor device according to claim 1, further comprising:

a switch unit configured to switch between connection and interruption between the output unit and the transfer unit of the memory unit.

15. The semiconductor device according to claim 14, wherein the output unit includes a semiconductor layer, and
the switch unit is in the semiconductor layer.

16. The semiconductor device according to claim 1, wherein the semiconductor device is configured as an analog memory device.

17. The semiconductor device according to claim 16, wherein the semiconductor device is configured as an analog memory array system having an array-shape and including a plurality of the analog memory devices arranged in parallel.

18. The semiconductor device according to claim 17, wherein the analog memory array system includes a plurality of gate electrode units individually paired with each of a plurality of gate units are electrically connected to each other between the analog memory devices arranged in parallel, and the plurality of gate units includes the gate unit.

* * * * *